United States Patent
Hsu et al.

(10) Patent No.: US 11,418,193 B2
(45) Date of Patent: Aug. 16, 2022

(54) KEY UNIT AND KEYBOARD USING THE SAME

(71) Applicant: PIXART IMAGING INC., Hsin-Chu (TW)

(72) Inventors: Che-Chia Hsu, Hsin-Chu (TW);
Yu-Han Chen, Hsin-Chu (TW);
Chi-Chieh Liao, Hsin-Chu (TW)

(73) Assignee: PIXART IMAGING INC., Hsin-Chu (TW)

( * ) Notice: Subject to any disclaimer, the term of this patent is extended or adjusted under 35 U.S.C. 154(b) by 175 days.

(21) Appl. No.: 16/843,570

(22) Filed: Apr. 8, 2020

(65) Prior Publication Data
US 2021/0320659 A1 Oct. 14, 2021

(51) Int. Cl.
*H03K 17/98* (2006.01)
*H03K 17/96* (2006.01)
*H01H 13/705* (2006.01)
*H01H 3/12* (2006.01)
*G06F 3/02* (2006.01)

(52) U.S. Cl.
CPC ........... *H03K 17/98* (2013.01); *G06F 3/0202* (2013.01); *H01H 3/12* (2013.01); *H01H 13/705* (2013.01); *H03K 17/9622* (2013.01)

(58) Field of Classification Search
CPC .. H03K 17/98; H03K 17/9622; G06F 3/0202; H01H 3/12; H01H 13/705
USPC .................. 345/168; 200/5 A, 600; 324/684; 713/186
See application file for complete search history.

(56) References Cited

U.S. PATENT DOCUMENTS

| 8,735,755 | B2 * | 5/2014 | Peterson | H03K 17/98 200/600 |
| 8,836,350 | B2 * | 9/2014 | Peter | H03K 17/962 324/684 |
| 10,120,506 | B2 * | 11/2018 | Chen | G06F 3/0416 |
| 2002/0095588 | A1 * | 7/2002 | Shigematsu | G06Q 20/367 713/186 |
| 2013/0126325 | A1 * | 5/2013 | Curtis | H03K 17/9622 200/5 A |
| 2014/0138227 | A1 * | 5/2014 | Chen | H01H 13/83 200/5 A |
| 2014/0166454 | A1 * | 6/2014 | Chen | H03K 17/975 200/5 A |
| 2020/0004337 | A1 * | 1/2020 | Hendren | G06F 1/1616 |

* cited by examiner

*Primary Examiner* — Prabodh M Dharia
(74) *Attorney, Agent, or Firm* — Li & Cai Intellectual Property (USA) Office

(57) ABSTRACT

A key unit and a keyboard using the same are provided. The key unit includes a circuit board, an elastic element, a keycap, and a processing circuit. The circuit board includes a capacitance sensing circuit embedded therein, and the capacitance sensing circuit includes a pair of sensor electrodes. The elastic element is disposed on the circuit board. The keycap is moveably disposed above and spaced apart from the circuit board. The elastic element is disposed between the keycap and the circuit board so that the keycap moves between a non-depressed position and a depressed position with respect to the circuit board. The processing circuit is electrically connected to the pair of sensor electrodes to obtain a variation of a coupling capacitance between the pair of sensor electrodes and to determine whether the keycap is touched or depressed according to the variation of coupling capacitance.

22 Claims, 21 Drawing Sheets

KEY UNIT AND KEYBOARD USING THE SAME

FIELD OF THE DISCLOSURE

The present disclosure relates to an input unit and a keyboard using the same, and more particularly to a key unit and a keyboard using the same.

BACKGROUND OF THE DISCLOSURE

Keyboards are widely used in a computer system to serve as a user interface so that a user can operate the computer system. One of the most common keyboard types is a "dome-switch" keyboard.

When a key is depressed, the keycap of the key pushes a rubber dome disposed beneath the keycap. The rubber dome is compressed and a tactile feedback is given to the user pressing the key. At the same time, the deformation of the rubber dome forces a conductive membrane disposed below the rubber dome to deform and be in contact with a pair of conductive traces on the printed circuit board (PCB), thereby closing a switch corresponding to the key.

A chip in the keyboard emits a scanning signal along each pair of conductive traces on the PCB to all the keys. When the signal corresponding to one of the pairs of conductive traces changes due to the contact of the conductive membrane, the chip generates a code corresponding to the key connected to that pair of conductive traces and then transmits the code to a processor of a computer, so that the processor can generate a command corresponding to the key that is depressed.

However, the key has to be depressed for a certain distance so as to trigger the switch corresponding to the key. Furthermore, when two or more keys, such as an "A" key, a "W" key, and a "Q" key of the keyboard are depressed at the same time, it is likely for the chip to erroneously judge that a signal corresponds to another key, such as an "S" key, that is not depressed, which results in "phantom switch" problems.

SUMMARY OF THE DISCLOSURE

In response to the above-referenced technical inadequacies, the present disclosure provides a key unit and a keyboard using the same.

In one aspect, the present disclosure provides a key unit including a circuit board, an elastic element, a keycap, and a processing circuit. The circuit board includes a capacitance sensing circuit embedded therein, and the capacitance sensing circuit includes a pair of sensor electrodes which are spaced apart from each other. The elastic element is disposed on the circuit board. The keycap is moveably disposed above and spaced apart from the circuit board. The elastic element is disposed between the keycap and the circuit board so that the keycap moves between a non-depressed position and a depressed position with respect to the circuit board. The processing circuit is electrically connected to the pair of sensor electrodes to obtain a variation of a coupling capacitance between the pair of sensor electrodes and to determine whether the keycap is touched or depressed according to the variation of coupling capacitance. When the variation of the coupling capacitance is greater than a first threshold value and less than a second threshold value, the keycap is determined to be touched. When the variation of the coupling capacitance is greater than the second threshold value, the keycap is determined to be depressed.

In certain embodiments, the present disclosure provides a key unit further including a floating conductive structure disposed between the keycap and the circuit board or disposed on an outer surface of the keycap. The floating conductive structure moves with a motion of the keycap.

In certain embodiments, the present disclosure provides a key unit, in which the elastic element includes a connection portion that connects to the keycap and a protrusion portion that extends from the connection portion toward the circuit board. When the keycap is in a non-depressed position, the protrusion portion is spaced apart from the circuit board.

In certain embodiments, the present disclosure provides a key unit further including a floating conductive structure including a first conductive layer disposed on an end of the protrusion portion.

In certain embodiments, the present disclosure provides a key unit further including a floating conductive structure including a second conductive layer disposed between an inner surface of the keycap and the connection portion.

In certain embodiments, the present disclosure provides a key unit, in which the circuit board has an opening in alignment with the protrusion portion. When the keycap moves toward the circuit board, the protrusion portion is pushed into the opening without being in contact with the pair of the sensor electrodes.

In certain embodiments, the present disclosure provides a key unit, in which the circuit board further includes a switch sensing circuit having at least a contact point that is in alignment with the protrusion portion. The capacitance sensing circuit is disposed above and insulated from the switch sensing circuit. The circuit board has an opening in alignment with the contact point, and the opening passes through the capacitance sensing circuit and does not pass through the switch sensing circuit.

In certain embodiments, the present disclosure provides a key unit further including a flexible conductive film disposed on and insulated from the capacitance sensing circuit. The flexible conductive film covers the opening. When the keycap moves toward the circuit board, the protrusion portion forces the flexible conductive film to deform so that the flexible conductive film extends into the opening to contact the contact point below.

In certain embodiments, the present disclosure provides a key unit further including a floating conductive structure, and the floating conductive structure includes an inner conductive layer and an outer conductive surface respectively disposed on an inner surface and an outer surface of the keycap.

In certain embodiments, the present disclosure provides a key unit, in which the circuit board includes a membrane, and the pair of the sensor electrodes are respectively disposed at two opposite sides of the membrane so as to be insulated from each other. The pair of the sensor electrodes does not overlap with each other in a direction of motion of the keycap.

In one aspect, the present disclosure provides a keyboard including a plurality of key units and a processing circuit, and each of the key units includes a circuit board, an elastic element, and a keycap. The circuit board includes a capacitance sensing circuit embedded therein, and the capacitance sensing circuit includes a pair of sensor electrodes which are spaced apart from each other. The elastic element is disposed on the circuit board. The keycap is moveably disposed above and spaced apart from the circuit board. The elastic element is disposed between the keycap and the circuit board so that the keycap moves between a non-depressed position and a depressed position with respect to the circuit board. The processing circuit is electrically connected to the pair of sensor electrodes of each of the key units to obtain a variation of a coupling capacitance between the pair of sensor electrodes and to determine whether the keycap is touched or depressed according to the variation of coupling capacitance. When the variation of the coupling capacitance is greater than a first threshold value and less than a second threshold value, the keycap is determined to be touched. When the variation of the coupling capacitance is greater than the second threshold value, the keycap is determined to be depressed.

In certain embodiments, the present disclosure provides a keyboard further includes a processor electrically connected to the processing circuit. The processor determines whether a series of key units are touched or pressed continuously in a predetermined sequence according to the variations of the coupling capacitance respectively corresponding thereto.

In certain embodiments, the present disclosure provides a keyboard includes a processor electrically connected to the key units and a memory electrically connected to the processor. The memory stores a first program corresponding to a first gesture, and the processor determines whether a gesture performed by a user is the first gesture or not. The first gesture is touching a number of key units to form a particular trace while pressing and holding down on another one of the key units.

Therefore, one of the advantages of the present disclosure is that in the key unit and the keyboard using the same provided herein, by the technical features of "a circuit board including a capacitance sensing circuit embedded therein," "the capacitance sensing circuit includes a pair of sensor electrodes which are spaced apart from each other" and "a processing circuit electrically connected to the pair of sensor electrodes to obtain a variation of a coupling capacitance between the pair of sensor electrodes and to determine whether the keycap 12 is touched or depressed according to the variation of coupling capacitance," the accuracy of detection can be improved and the "phantom switch" problems can be prevented even if more than two key units of the keyboard are depressed at the same time.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
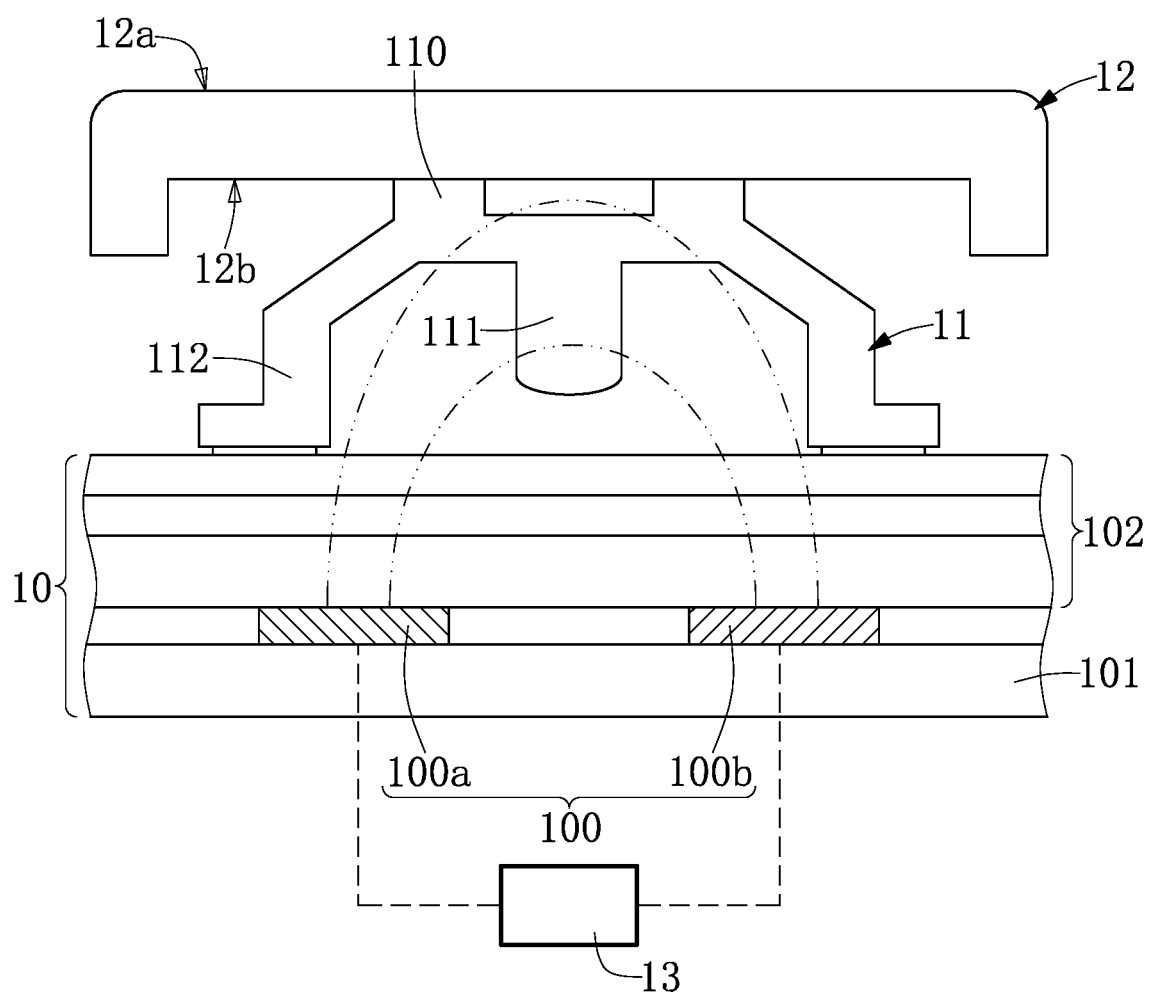
FIG. 1 is a schematic sectional view of a key unit in an undepressed state according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
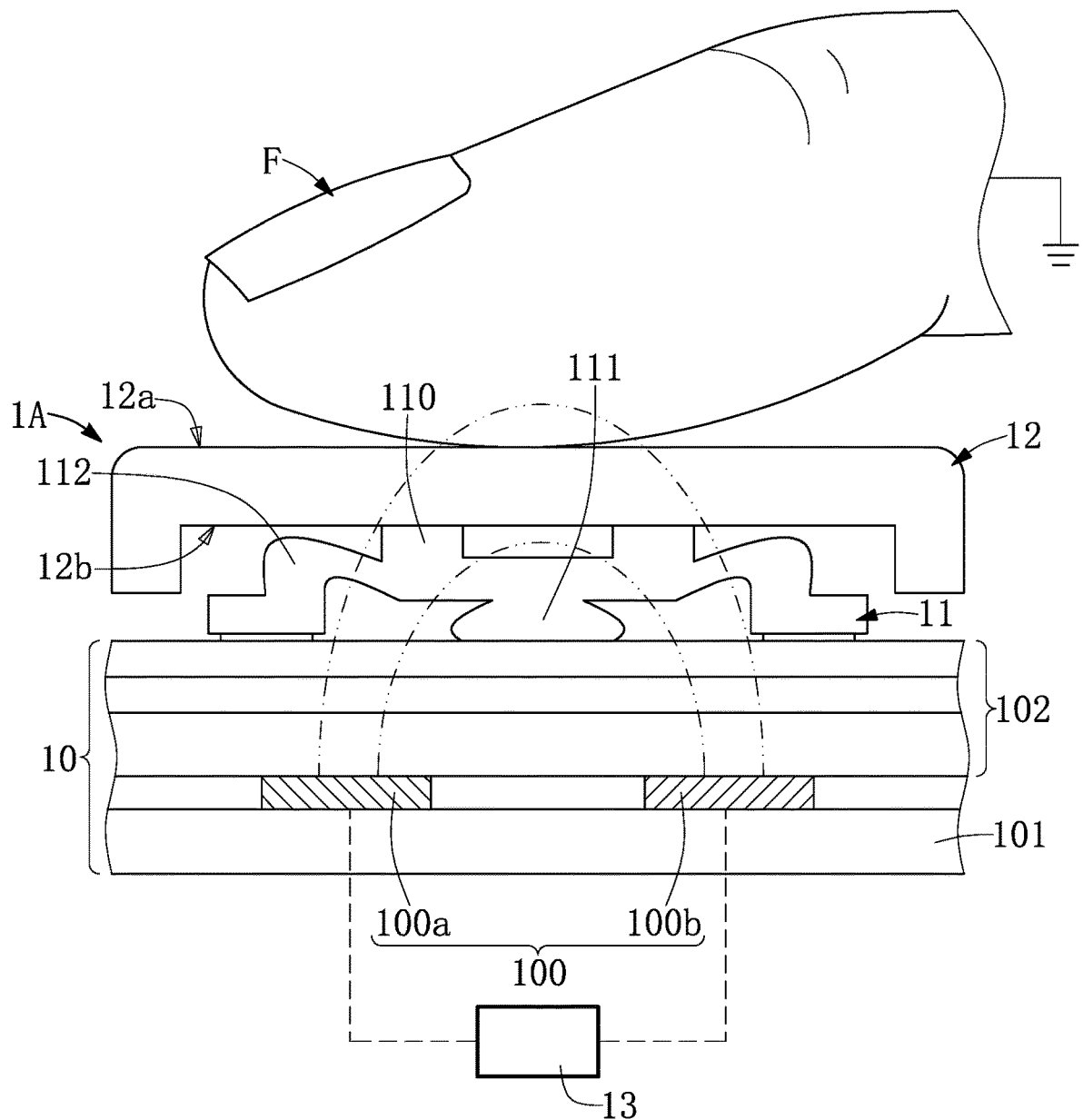
FIG. 2 is a schematic sectional view of the key unit held in a depressed state according to the first embodiment of the present disclosure.

Reference is made to FIG. 1 and FIG. 2, which are schematic sectional views of a key unit respectively in an undepressed state and a depressed state according to a first embodiment of the present disclosure.

It should be noted that only a portion of the keyboard is illustrated in FIG. 1 and FIG. 2 to describe the details of the key unit in the present disclosure. The key unit 1A provided in the present disclosure can be implemented in any keyboard that is electrically connected to a personal computer or integrated within the housing or chassis of other device components.

In the instant embodiment, the key unit 1A includes a circuit board 10, an elastic element 11 and a keycap 12. One keyboard could include a plurality of key units 1A and each of the key units 1A represents a corresponding character or command A processing circuit 13 is incorporated in the keyboard and couple to the plurality of key units 1A.

As shown in FIG. 1, the circuit board 10 at least includes a capacitance sensing circuit 100 embedded therein for obtaining a variation of a capacitance. Specifically, the capacitance sensing circuit 100 includes a pair of sensor electrodes, such as a first sensor electrode 100$a$ and a second sensor electrode 100$b$. It should be noted that each pair of the first sensor electrode 100$a$ and the second sensor electrode 100$b$ are insulated from each other so as to form an effective capacitor at each sensing location.

When a bias is applied to the first sensor electrode 100$a$ or the second sensor electrode 100$b$, an electric field can be created between the first and second sensor electrodes 100$a$, 100$b$. Accordingly, an object near the pair of the first and second sensor electrodes 100$a$, 100$b$ would cause the electric field to be varied, thereby varying the coupling capacitance between the first sensor electrode 100$a$ and the second sensor electrode 100$b$. As such, by detecting the coupling capacitance between the pair of the first and second sensor electrodes 100$a$, 100$b$, a state of the key unit 1A can be determined.

In the instant embodiment, the circuit board 10 includes an insulating layer 101, and the capacitance sensing circuit 100 is formed on the insulating layer 101. Furthermore, the circuit board 10 further includes at least one membrane 102 (more than one of which are illustrated in FIG. 1 and FIG. 2), and the membrane 102 is disposed on and covers the capacitance sensing circuit 100 so as to prevent the capacitance sensing circuit 100 from being damaged.

As shown in FIG. 1, the elastic element 11 is disposed on the circuit board 10. In one embodiment, the elastic element 11 is compressible and resilient. The elastic element 11 is connected between the circuit board 10 and the keycap 12, such that the keycap 12 can be moveably disposed on the circuit board 10. That is to say, the keycap 12 can moves between a non-depressed position and a depressed position with respect to the circuit board 10.

Specifically, in the instant embodiment, the elastic element 11 includes a connection portion 110, a protrusion portion 111, and a supporting portion 112. The connection portion 110 and the supporting portion 112 are respectively connected to the keycap 12 and the circuit board 10. As such, when the key unit 1A is in the undepressed state (i.e., the keycap 12 is located at the non-depressed position), the keycap 12 can be disposed above the circuit board 10 without being contact with the circuit board 10.

Furthermore, in the instant embodiment, the protrusion portion 111 extends from the connection portion 110 toward the circuit board 10. However, when the key unit 1A is in the undepressed state, the protrusion portion 111 is spaced apart from the circuit board 10, as shown in FIG. 1. That is to say, a gap exists between the protrusion portion 111 and the circuit board 10 before the keycap 12 is depressed.

It should be noted that as long as the keycap 12 can be maintained at a certain level relative to the circuit board 10, the structure of the elastic element 11 is not limited to the example provided herein. For example, the elastic element 11 can be a rubber dome or a metallic dome.

When the key unit 1A is pressed by a user with an object F, such as a finger, and held in the depressed state, the supporting portion 112 of the elastic element 11 is bent due to the applied pressure, and the protrusion portion 111 is forced to be compressed and in contact with the circuit board 10, as shown in FIG. 2.

In one embodiment, the key unit 1A further includes a supporting structure (not shown in FIG. 1) disposed between the keycap 12 and the circuit board 10. In one embodiment, the supporting structure is a scissors-shaped frame, and the elastic element 11 is disposed in the scissors-shaped frame. As such, the direction of movement of the keycap 12 can be limited to a thickness direction of the circuit board 10. However, the present disclosure is not limited thereto.

As mentioned above, the keycap 12 is moveably disposed above and spaced apart from the circuit board 1. The keycap 12 has an outer surface 12$a$ and an inner surface 12$b$. Furthermore, the keycap 12 can be made of, but not limited to, a conductive material, an insulting material or a composite material. For example, the keycap 12 can be a metal-plated plastic keycap.

Furthermore, in one embodiment, the user can input a command through not only pressing, but also through touching the key unit 1A. Specifically, the outer surface 12$a$ of the keycap 12 can serve as a touch sensitive surface.

As shown in FIG. 1, when a user touches the outer surface 12$a$ of the keycap 12 with an object F, such as a finger or a conductive object, and does not press the keycap 12, the electric field between the pair of the first and second sensor electrodes 100$a$, 100$b$ are altered, thus changing the coupling capacitance between the pair of the first and second sensor electrodes 100$a$, 100$b$.

In the instant embodiment, when the keycap 12 is pressed by the user with the object F, as shown in FIG. 1 and FIG. 2, the closer the keycap 12 is to the capacitance sensing circuit 100, the greater the variation of the electric field caused by the object F. Accordingly, compared to a situation where the keycap 12 is located at the non-depressed position, the coupling capacitance between the pair of the first and second sensor electrodes 100$a$, 100$b$ would become greater.

However, in another embodiment, the coupling capacitance may become lower during the depression process of the keycap 12. Accordingly, in the present disclosure, according to a variation of the coupling capacitance, the state of the key unit 1A can be determined. It should be noted that in different embodiments, the variation of the coupling capacitance may be positive or negative during the depression of the keycap 12, which may be dependent on the dielectric coefficient of the elastic element 11 or the material of the keycap 12. Accordingly, whether the coupling capacitance is positively or negatively varied with a depressing motion of the keycap 12 can be adjusted according to specific requirements.

As shown in FIG. 1 and FIG. 2, the processing circuit 13 is electrically connected to the pair of the first and second sensor electrodes 100a, 100b to detect the coupling capacitance between the pair of the first and second sensor electrodes 100a, 100b and to determine whether the keycap 12 is touched or depressed according to the coupling capacitance.

Specifically, the capacitance sensing circuit 100 can transmit a coupling capacitance signal, such as a current value or a voltage value, to the processing circuit 13, so that the processing circuit 13 can measure the variation of the coupling capacitance and determine whether the variation of the coupling capacitance is greater than a first threshold value or not. When the variation of the coupling capacitance is greater than a first threshold value, the keycap 12 is determined to be touched.

Furthermore, the processing circuit 13 can determine whether the keycap 12 is depressed beyond a predetermined position or not according to the variation of the coupling capacitance. To be more specific, the processing circuit 13 determines whether the variation of the coupling capacitance is greater than a second threshold value or not. When the variation of the coupling capacitance is greater than the second threshold value, the keycap is determined to be depressed beyond the predetermined position.

In one embodiment, the absolute value of the second threshold is larger than the absolute value of the first threshold. That is to say, the variation of the coupling capacitance would reach the first threshold value when the keycap 12 is touched, and then reach the second threshold value when the keycap 12 is depressed gradually.

Second Embodiment

Figure 3:
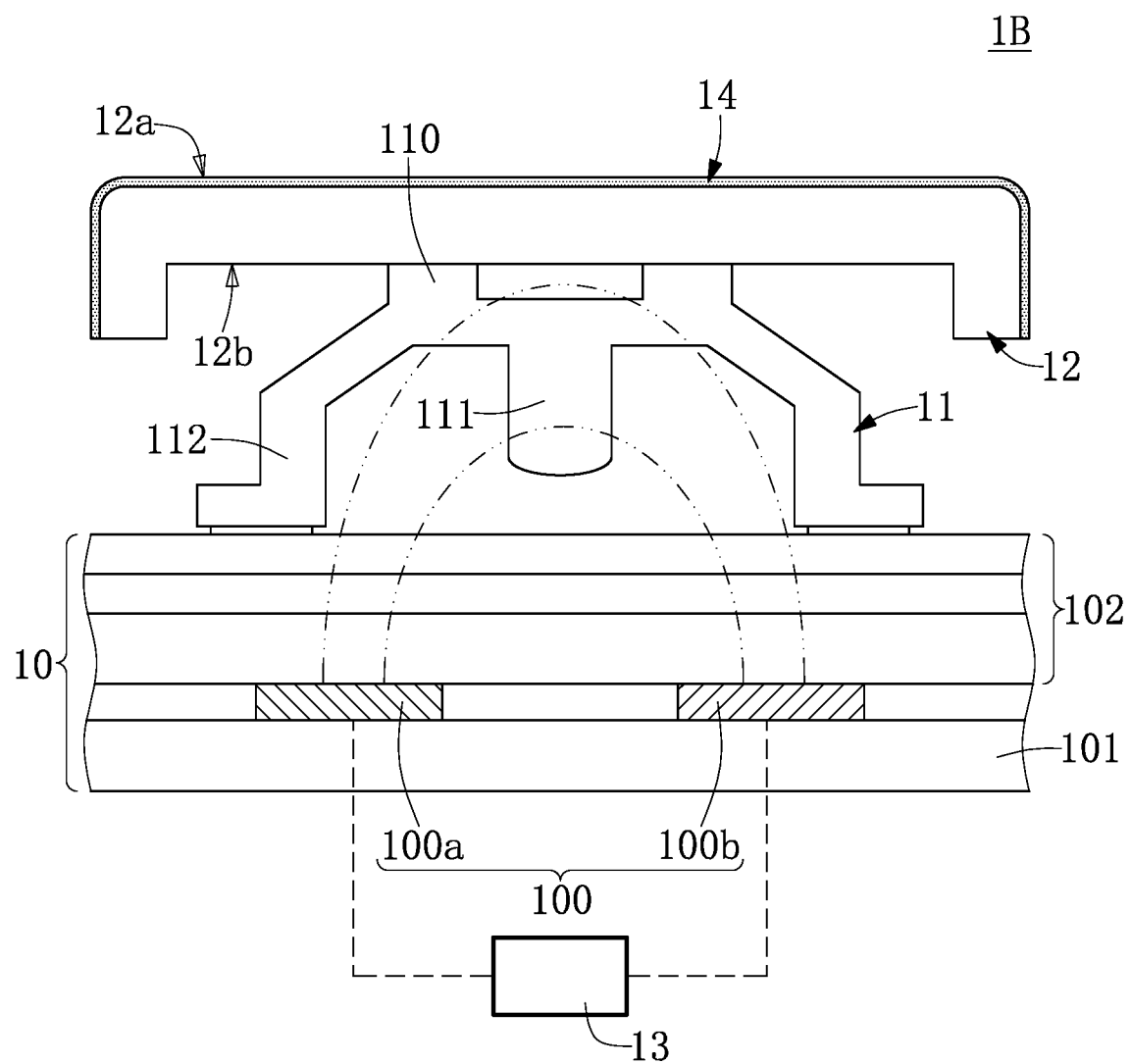
FIG. 3 is a schematic sectional view of a key unit in an undepressed state according to a second embodiment of the present disclosure.

Reference is made to FIG. 3, which is a schematic sectional view of a key unit in an undepressed state according to a second embodiment of the present disclosure. The elements which are similar to or the same as those shown in FIG. 1 are denoted by similar or the same reference numerals, and will not be reiterated herein.

The key unit 1B further includes a floating conductive structure 14. The conductive structure 14 can be disposed between the keycap 12 and the circuit board 10 or disposed on the outer surface 12a of the keycap 12. In the second embodiment, the floating conductive structure 14 is a conductive layer that is disposed on the outer surface 12a of the keycap 12.

When the keycap 12 is depressed, the floating conductive structure 14 becomes closer to the capacitance sensing circuit 11 so that the electric field between the pair of the first and second sensor electrodes 100a, 100b is altered, thereby changing the coupling capacitance. That is to say, the floating conductive structure 14 moves with a motion of the keycap 12, such that the coupling capacitance is varied. It should be noted that by disposing the floating conductive structure 14, the electric field between the pair of the first and second sensor electrodes 100a, 100b is still altered even though the keycap 12 is depressed by a nonconductive object (such as a plastic stylus).

It should be noted that the floating conductive structure 14 is not limited to the example provided herein. In another embodiment, the floating conductive structure 14 can be disposed on at least one of the inner surface 12b and the outer surface 12a of the keycap 12. That is, the floating conductive structure 14 can be disposed on only the inner surface 12b of the keycap 12, or includes an inner conductive layer and an outer conductive layer which are respectively disposed on the inner and outer surfaces 12b, 12a of the keycap 12.

In yet another embodiment, the keycap 12 can be made completely of a conductive material to serve as the floating conductive structure.

Third Embodiment

Figure 4:
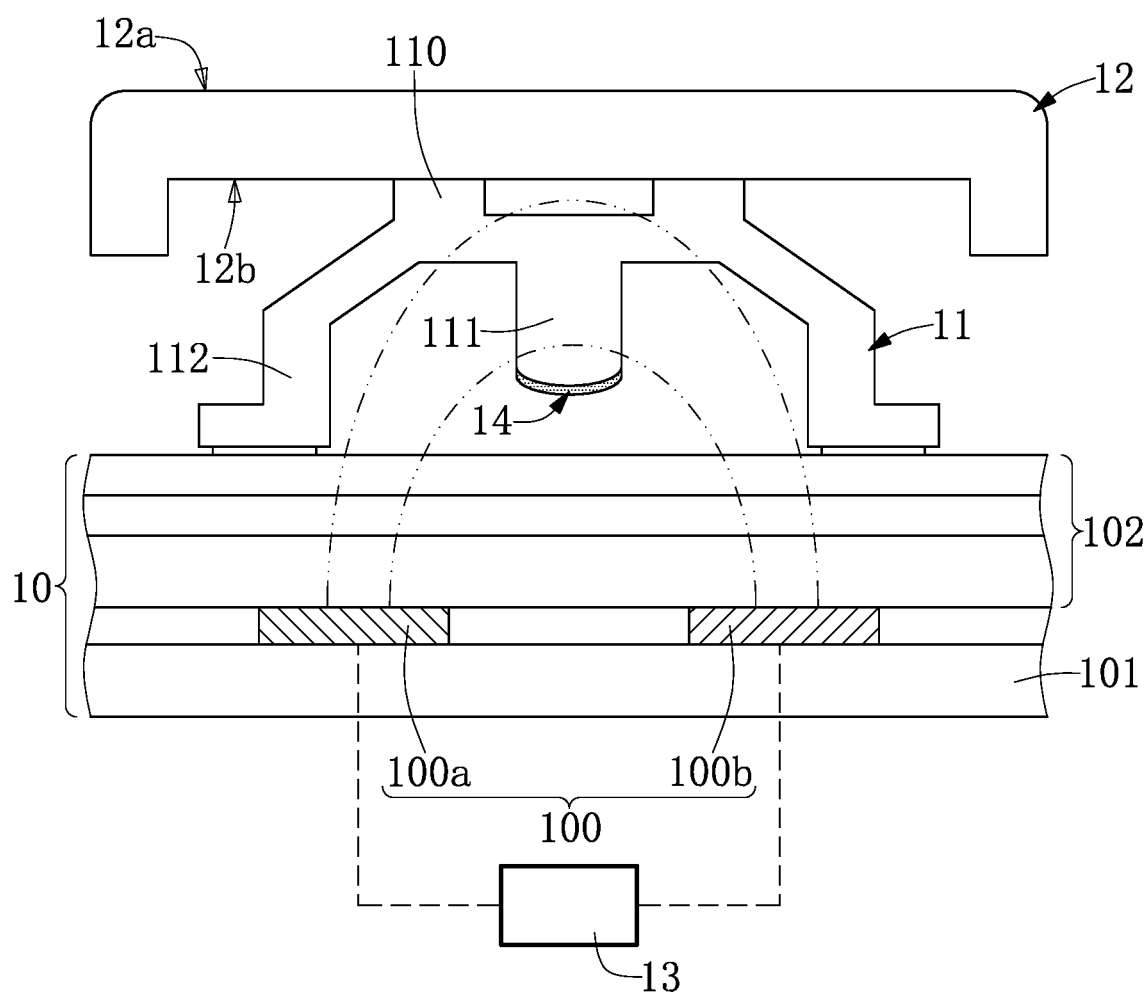
FIG. 4 is a schematic sectional view of a key unit in an undepressed state according to a third embodiment of the present disclosure.

Reference is made to FIG. 4, which is a schematic sectional view of a key unit in an undepressed state according to a third embodiment of the present disclosure. The elements which are similar to or the same as those shown in FIG. 3 are denoted by similar or the same reference numerals, and will not be reiterated herein.

In the third embodiment, the floating conductive structure 14 of the key unit 1C is disposed between the keycap 12 and the circuit board 10. The floating conductive structure 14 is formed at the surface of the elastic element 11. Specifically, in the instant embodiment, the floating conductive structure 14 is also a conductive layer that is disposed on an end of the protrusion portion 111. However, the conductive layer can be formed on another portion of the elastic element 11, and the present disclosure is not limited.

Furthermore, the floating conductive structure 14 can include more than one conductive layer, such as two conductive layers, which are respectively disposed on different elements.

Fourth Embodiment

Figure 5:
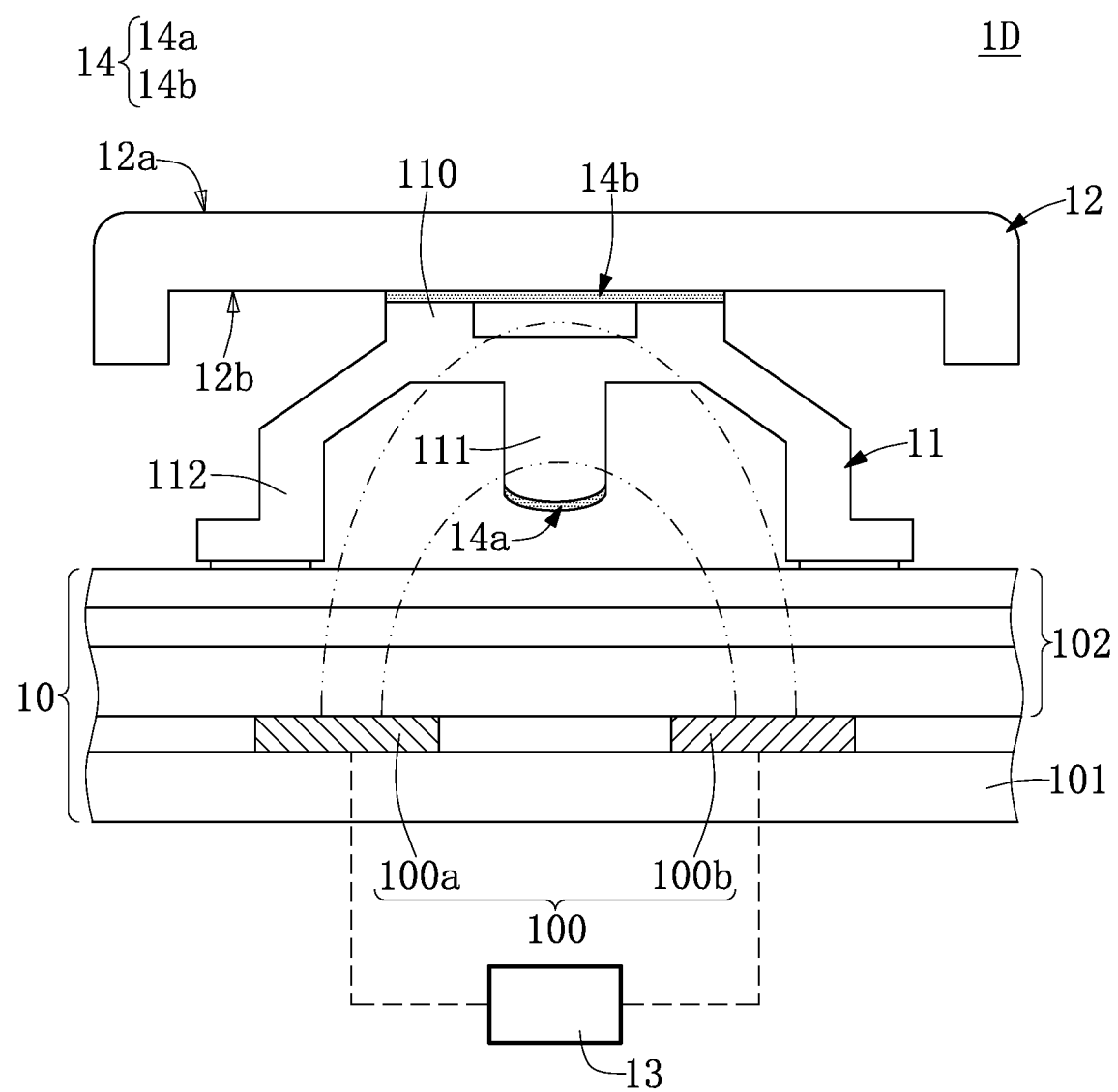
FIG. 5 is a schematic sectional view of a key unit in an undepressed state according to a fourth embodiment of the present disclosure.

Reference is made to FIG. 5, which is FIG. 5 is a schematic sectional view of a key unit in an undepressed state according to a fourth embodiment of the present disclosure.

In the fourth embodiment, the floating conductive structure 14 includes a first conductive layer 14a and a second conductive layer 14b, which are separate from each other. In the instant embodiment, both the first conductive layer 14a and the second conductive layer 14b are disposed between the keycap 12 and the circuit board 10. The first conductive layer 14a is disposed on an end of the protrusion portion 111 of the elastic element 11, and the second conductive layer 14b is disposed on the inner surface 12b of the keycap 12.

Furthermore, the second conductive layer 14b covers only a partial region of the inner surface 12b of the keycap 12. To be more specific, the second conductive 14b is disposed between the inner surface 12b of the keycap 12 and the connection portion 110 of the elastic element 11.

Figure 6:
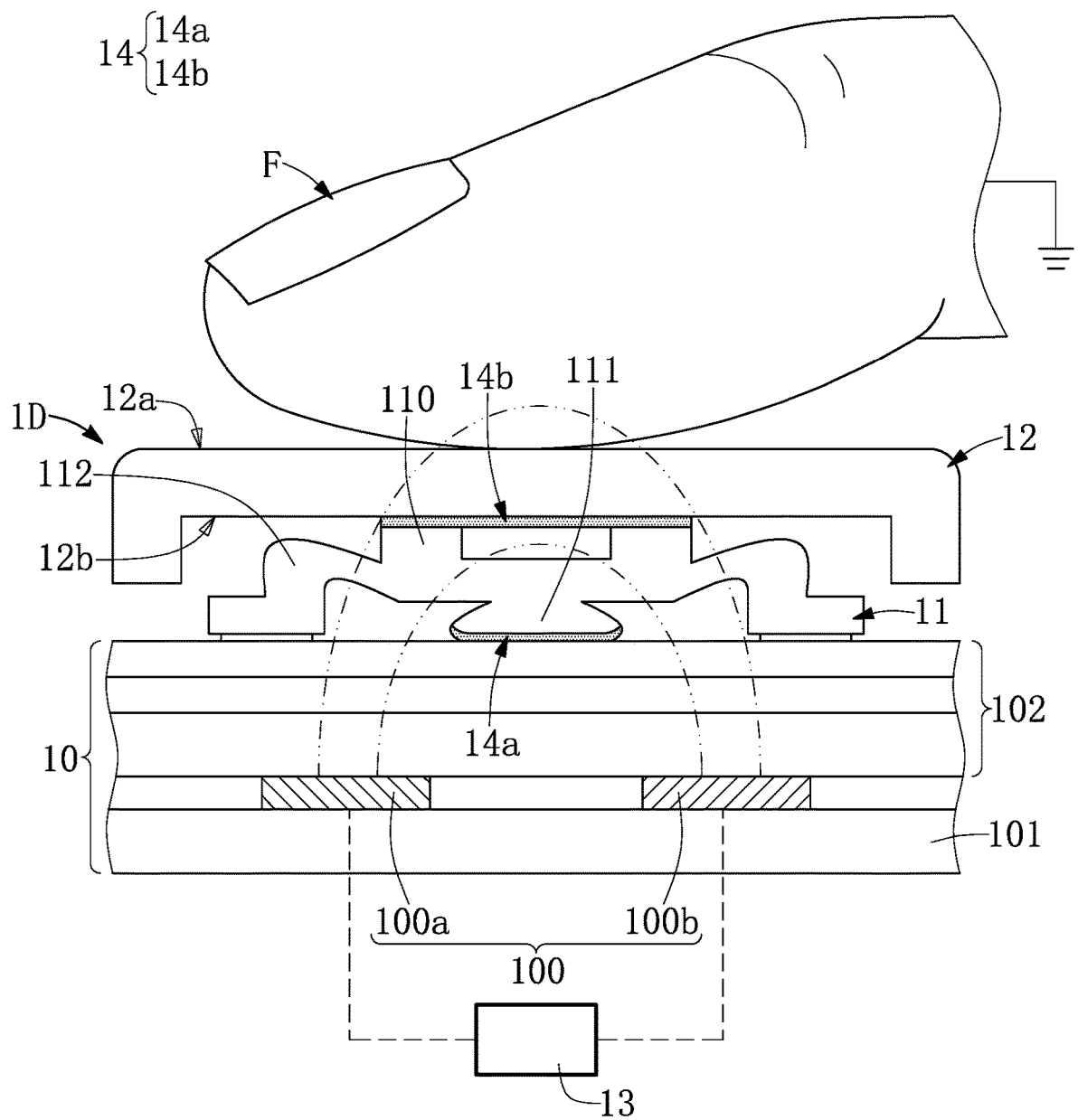
FIG. 6 is a schematic sectional view of the key unit held by a finger in the depressed state according to the fourth embodiment of the present disclosure.

Reference is made to FIG. 5 and FIG. 6, in which FIG. 6 is a schematic sectional view of the key unit held by a finger in the depressed state according to the fourth embodiment of the present disclosure.

For the key unit 1D of the fourth embodiment, when the outer surface 12a of the keycap 12 is touched by the finger F of the user without being applied with any pressure, i.e., the keycap 12 is touched but not pressed, some charges would be attracted to the finger F and then conducted to the ground. As such, the coupling capacitance between the pair of the first and second sensor electrodes 100a, 100b would become slightly lower.

In one embodiment, the processing circuit 13 can determine whether the keycap 12 is touched by the user according to the variation of the coupling capacitance. As mentioned previously, when the variation of the coupling capacitance is greater than the first threshold value and less than a second threshold value, the processing circuit 13 determines that the keycap 12 is touched.

As shown in FIG. 6, the keycap 12 is pressed by the user with the finger. It should be noted that although some charges are attracted to the finger F, the floating conductive structure 14 that includes the first and second conductive layers 14a, 14b becomes closer to the pair of the first and second sensor electrodes 100a, 100b during the depression of the keycap 12, which would cause the coupling capacitance to be greater. That is to say, when the keycap 12 is depressed, whether the variation of the coupling capacitance is positive or negative may be dependent on combined effects resulting from the finger F and the floating conductive structure 14.

In one embodiment, the position and the occupied area of the floating conductive structure 14 can be designed so that the floating conductive structure 14 can generate an effect on the variation of the coupling capacitance that is more comprehensive than that generated by the finger F. However, the present is not limited to the example provided herein.

Figure 7:
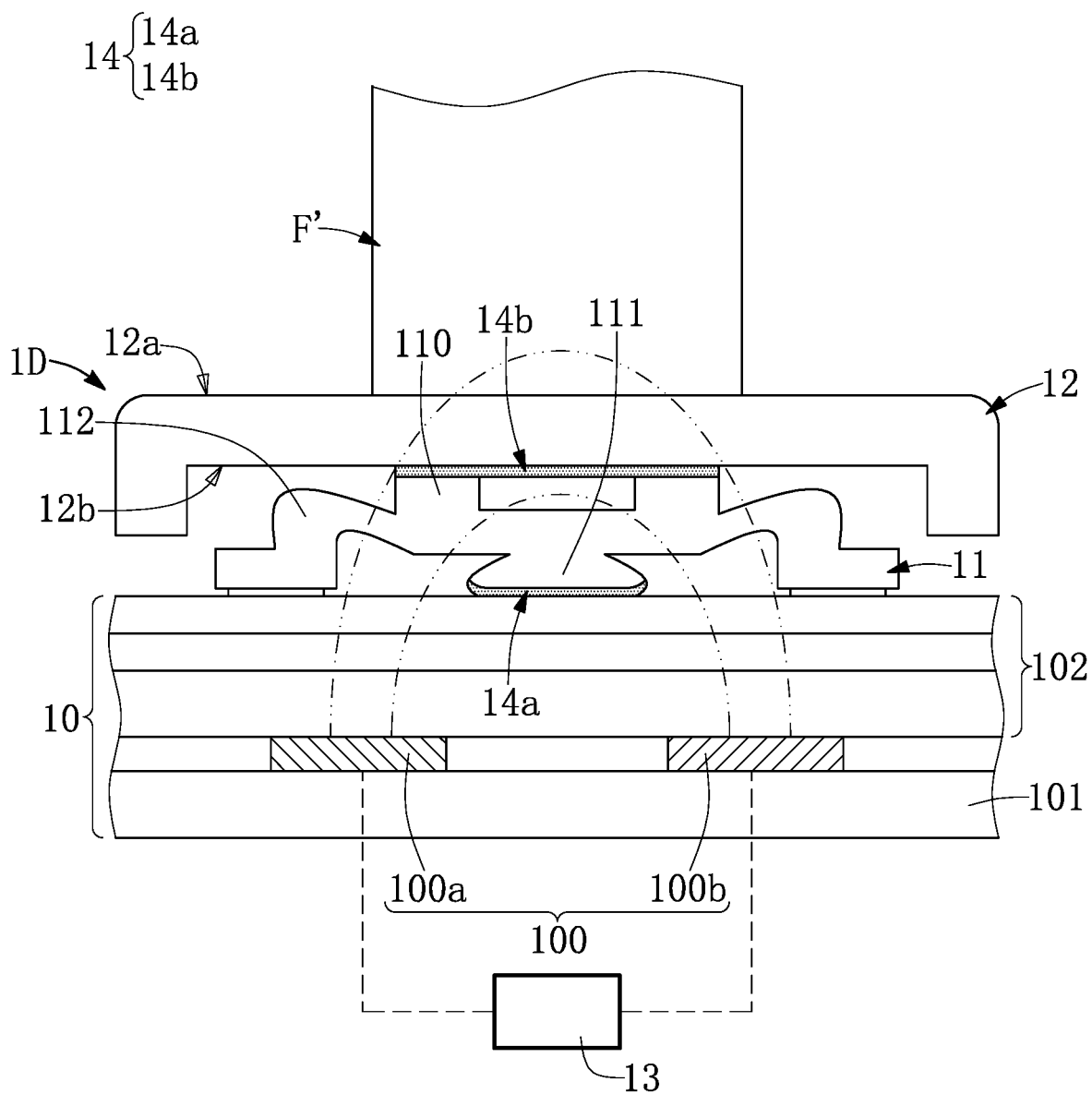
FIG. 7 is a schematic sectional view of the key unit held by an insulator object in the depressed state according to the fourth embodiment of the present disclosure.

Reference is made to FIG. 7, which is a schematic sectional view of the key unit held by an insulator object in the depressed state according to the fourth embodiment of the present disclosure. When the keycap 12 of the key unit 1D is pressed by a user with an insulator object F', only the effects of the floating conductive structure 14 is considered. That is to say, the coupling capacitance would become greater during the depression of the keycap 12 since the floating conductive structure 14 becomes closer to the capacitance sensing circuit 100. Accordingly, the variation of the coupling capacitance is positive.

Fifth Embodiment

Figure 8:
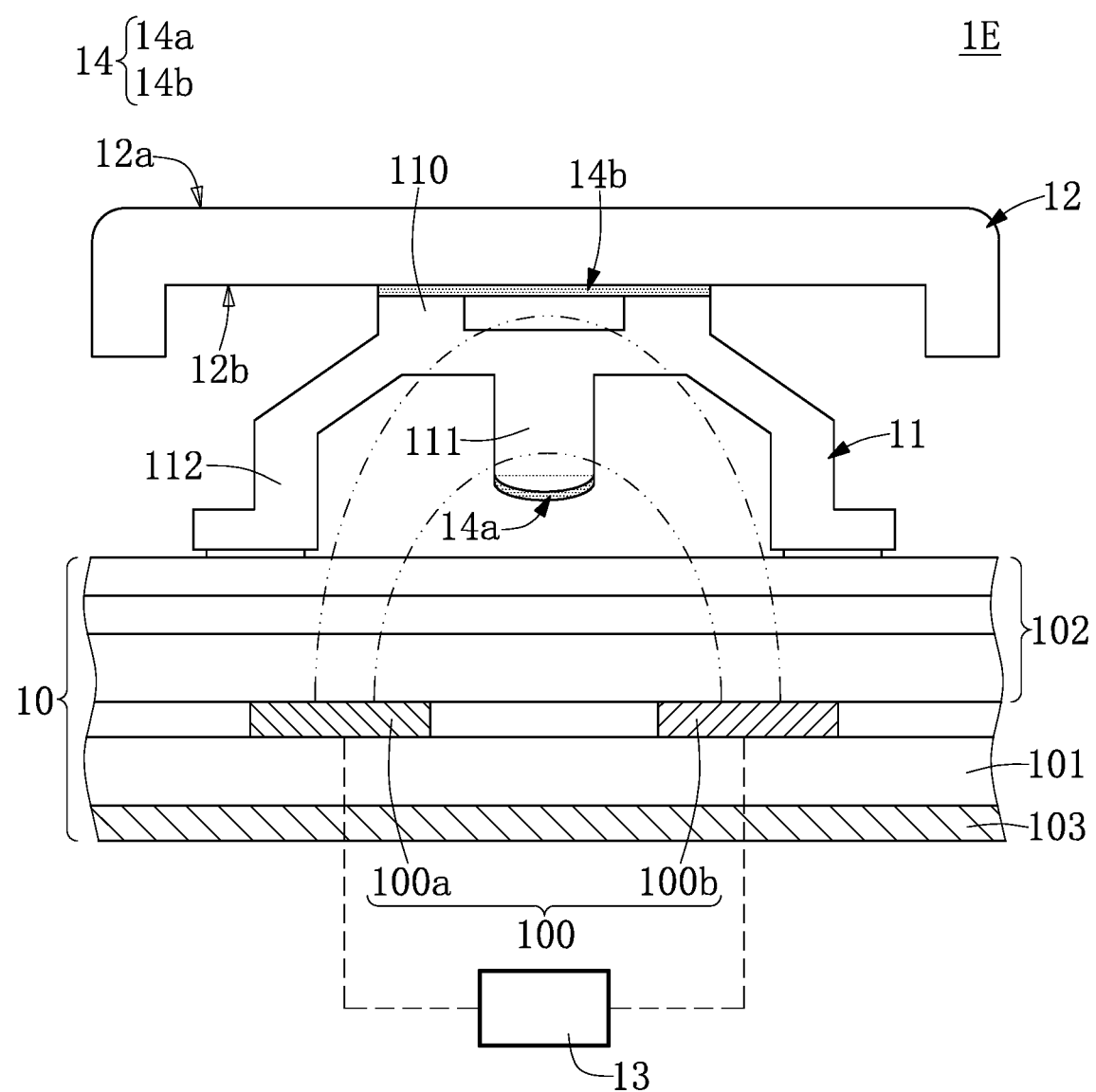
FIG. 8 is a schematic sectional view of a key unit in an undepressed state according to a fifth embodiment of the present disclosure.
Figure 9:
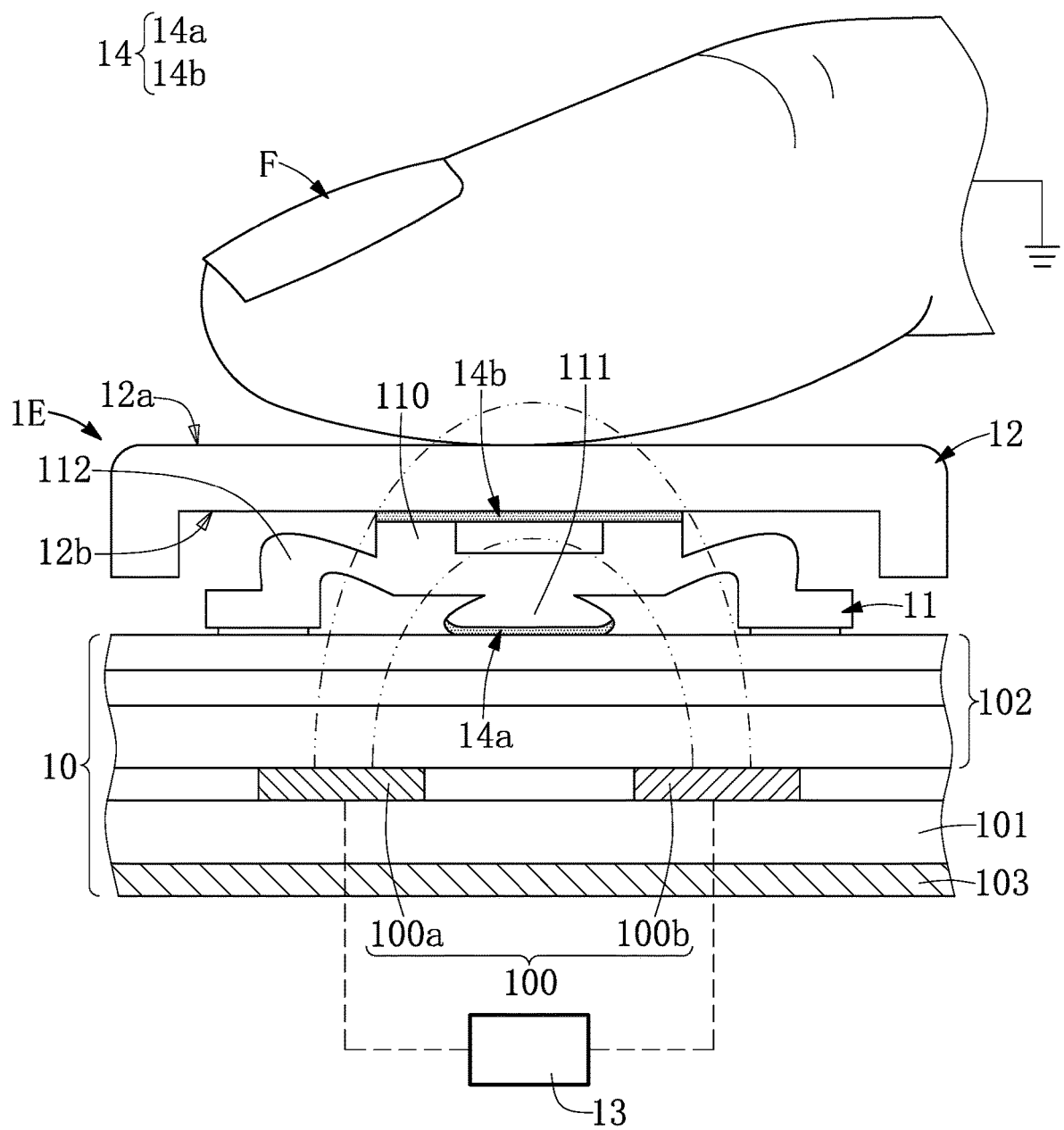
FIG. 9 is a schematic sectional view of the key unit held in a depressed state according to the fifth embodiment of the present disclosure.

Reference is made to FIG. 8 and FIG. 9, which are schematic sectional views of a key unit respectively in an undepressed state and in a depressed state according to a fifth embodiment of the present disclosure. The elements which are similar to or the same as those shown in FIG. 5 are denoted by similar or the same reference numerals, and will not be reiterated herein.

In the fifth embodiment, the circuit board 10 of the key unit 1E further includes a ground layer 103 disposed below the capacitance sending circuit 100. Furthermore, the ground layer 103 is insulated from the capacitance sensing circuit 100. The ground layer 103 can be made of a conductive material, such as aluminum, steel or copper.

It should be noted that when the keycap 12 is depressed, the ground layer 103 would provide more discharging paths of the charges in the effective capacitor, thereby reducing the coupling capacitance. In the instant embodiment, the effect of the ground layer 103 on the coupling capacitance is bigger than those of the floating conductive structure 14 and the material of the object F. That is, no matter whether the object F for pressing the keycap 12 is conductive or not, the coupling capacitance would become lower during the depression of the keycap 12.

It should be noted that it is not necessary for the pair of the first and second sensor electrodes 100a, 100b to be disposed at the same side of the insulating layer 101.

Sixth Embodiment

Figure 10:
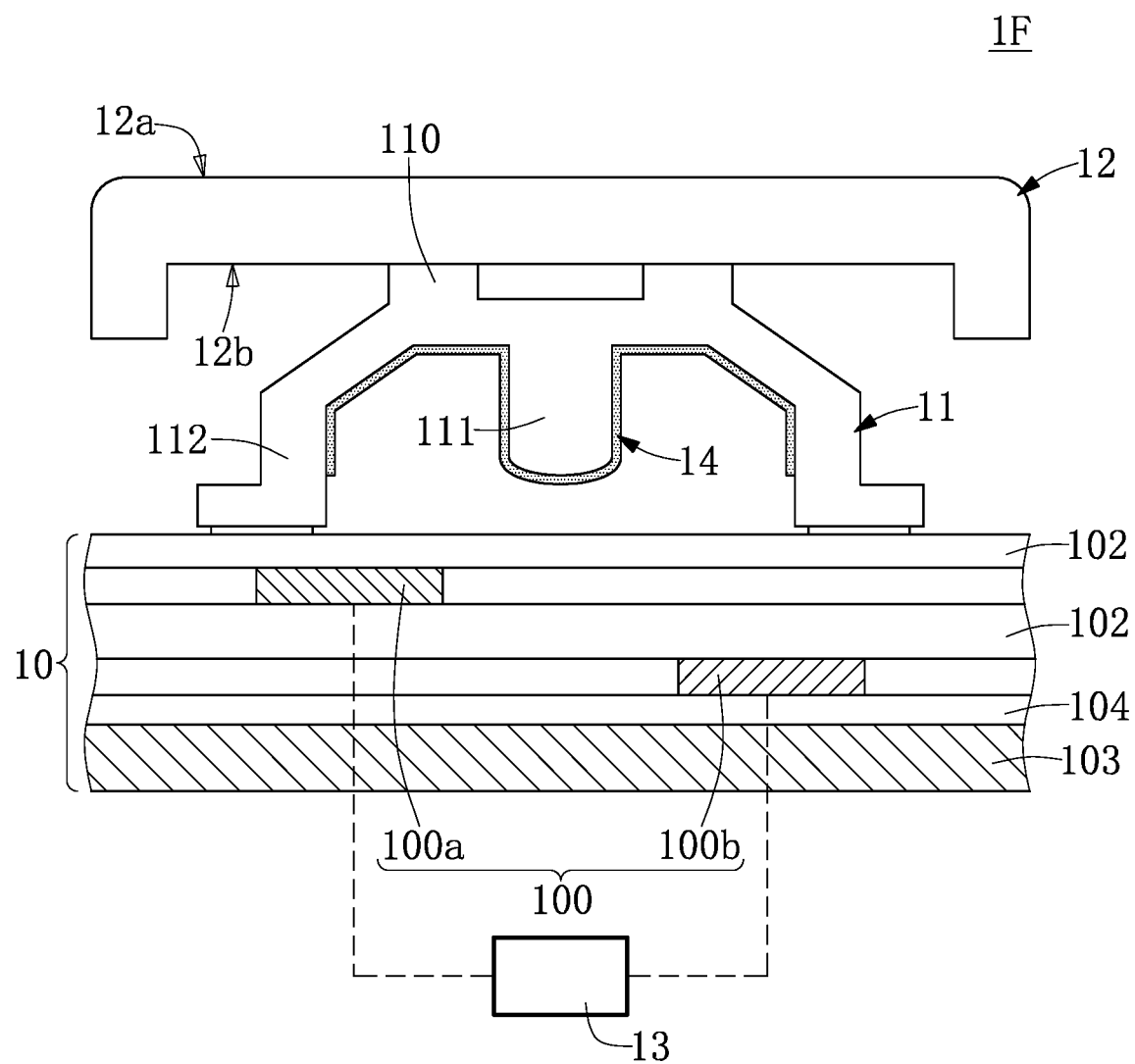
FIG. 10 is a schematic sectional view of a key unit in an undepressed state according to a sixth embodiment of the present disclosure.

Reference is made to FIG. 10, which is a schematic sectional view of a key unit in an undepressed state according to a sixth embodiment of the present disclosure.

In the key unit IF of the instant embodiment, the first and second sensor electrodes 100a, 100b of the capacitance sensing circuit 100 are disposed at the same membrane 102, but respectively disposed at two opposite sides of the membrane 102. As shown in FIG. 10, the first and second sensor electrodes 100a, 100b do not overlap with each other in a direction (vertical direction) of motion of the keycap 12 so as to prevent the coupling between the finger F and the second sensor electrode 100b that is located at a lower position from being interfered by the first sensor electrode 100a that is disposed at an higher position.

In one embodiment, after the first and second electrodes 100a, 100b are formed on the membrane 102, the membrane 102 together with the first and second sensor electrodes 100a, 100b formed thereon are connected to the ground layer 103 by an adhesive layer 104. In another embodiment, the membrane 102 together with the first and second sensor electrodes 100a, 100b formed thereon can be directly disposed on the ground layer 103.

Furthermore, in the instant embodiment, the floating conductive structure 14 is a conductive layer covering a portion of the elastic element 11. Specifically, the conductive layer partially covers the surfaces of the protrusion portion 111 and the supporting portion 112 that faces toward the circuit board 10.

Seventh Embodiment

Figure 11:
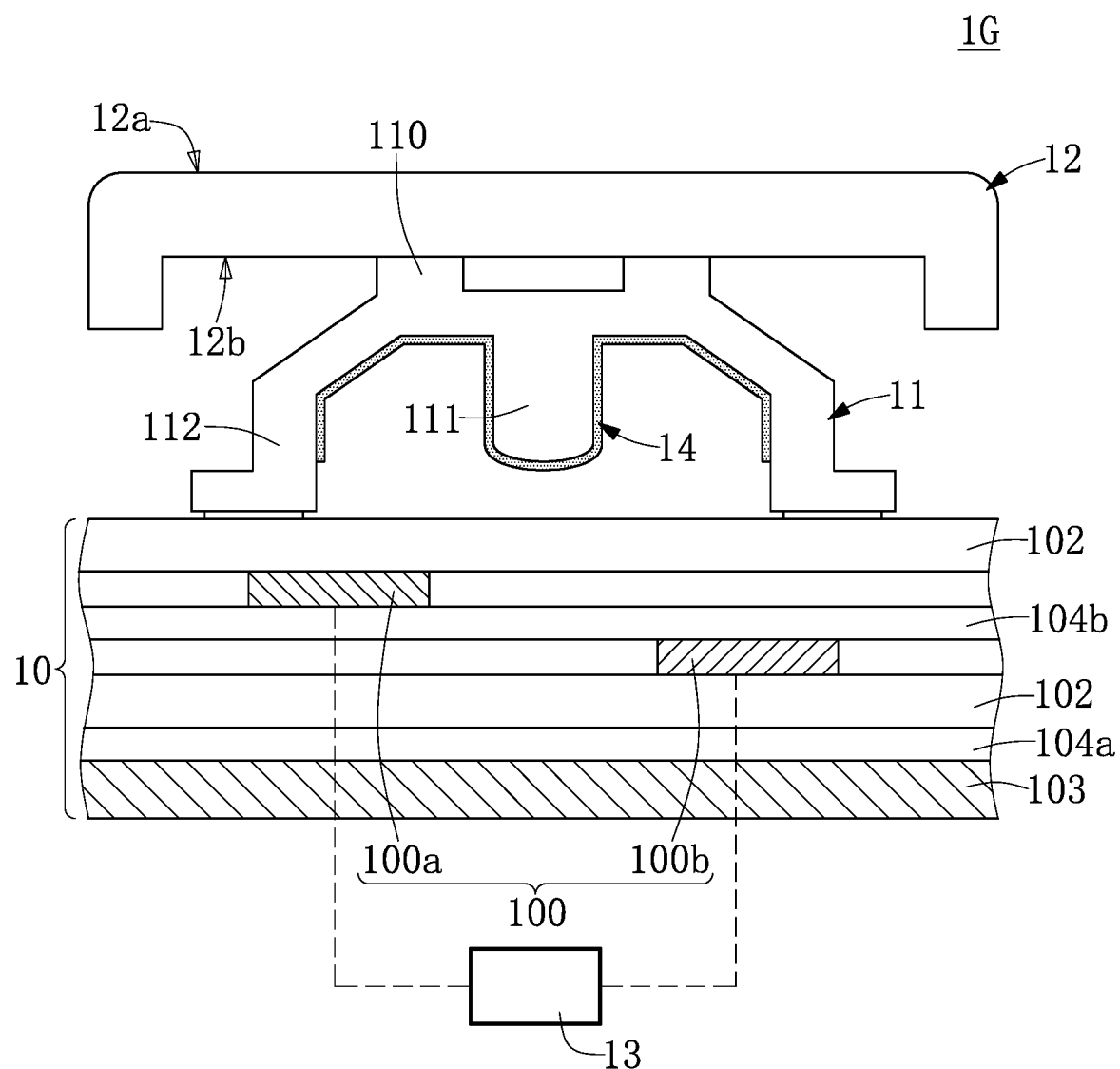
FIG. 11 is a schematic sectional view of a key unit in an undepressed state according to a seventh embodiment of the present disclosure.

Reference is made to FIG. 11, which is a schematic sectional view of a key unit in an undepressed state according to a seventh embodiment of the present disclosure. The elements which are similar to or the same as those shown in FIG. 10 are denoted by similar or the same reference numerals, and will not be reiterated herein.

In the key unit 1G of the instant embodiment, the first and second sensor electrodes 100a, 100b of the capacitance sensing circuit 100 are respectively disposed at two different membranes 102. In one embodiment, after the first and second electrodes 100a, 100b are respectively formed on the two membrane 102, one of the membranes 102 with the second sensor electrode 100b formed thereon is connected to the ground layer 103 by an adhesive layer 104a, and the other membrane 102 is connected to the one of the membranes with the second sensor electrode 100b formed thereon by another adhesive layer 104b. That is to say, the first and second sensor electrodes 100a, 100b, which are respectively formed at different membranes 102 and face toward each other, are vertically spaced apart from each other by the another adhesive layer 104b.

Eighth Embodiment

Figure 12:
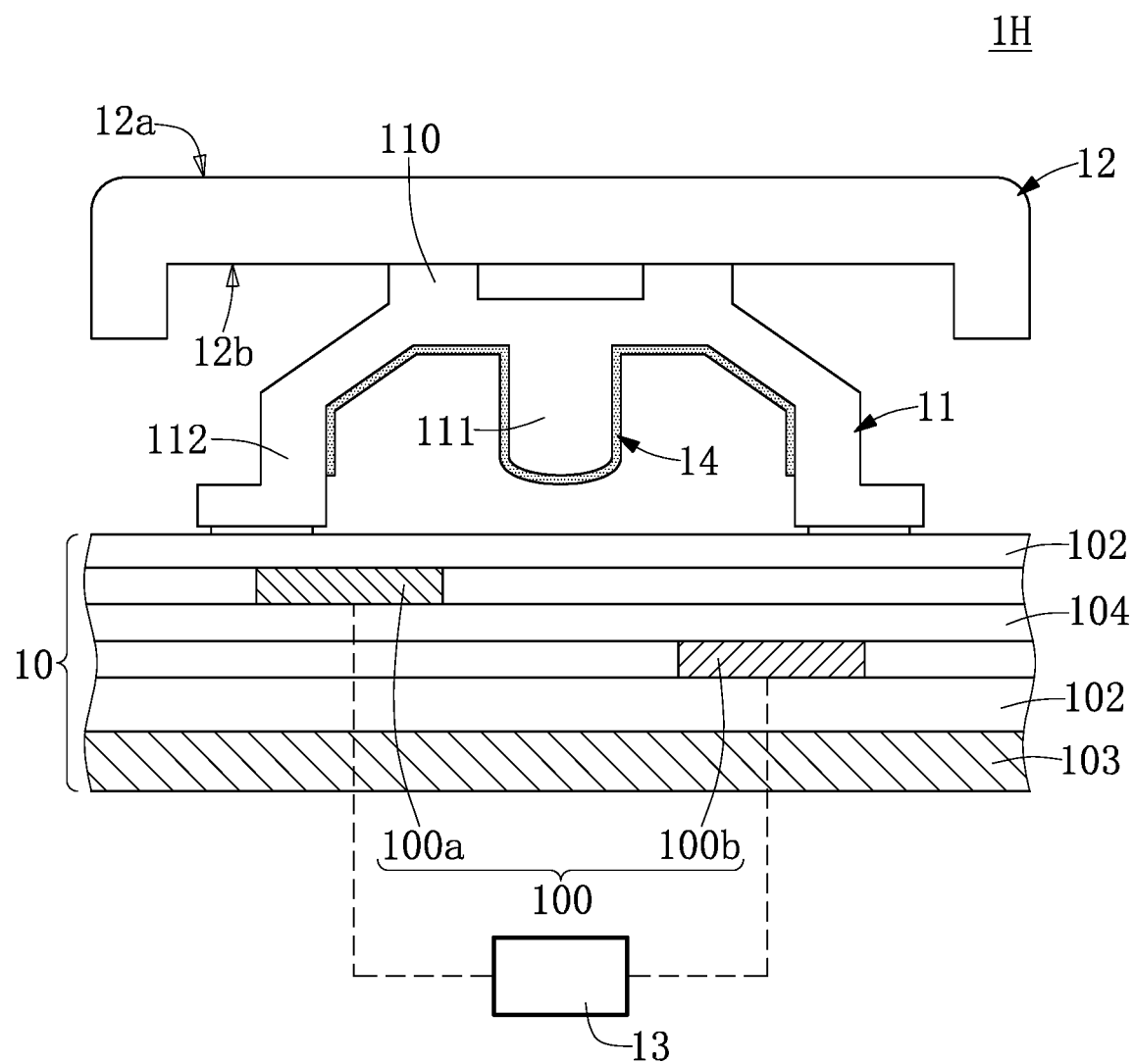
FIG. 12 is a schematic sectional view of a key unit in an undepressed state according to an eighth embodiment of the present disclosure.

Reference is made to FIG. 12, which is a schematic sectional view of a key unit in an undepressed state according to an eighth embodiment of the present disclosure. The elements which are similar to or the same as those shown in FIG. 11 are denoted by similar or the same reference numerals, and will not be reiterated herein.

In the key unit 1H of the instant embodiment, the adhesive layer 104b can be omitted. That is to say, the membrane 102 with the second sensor electrode 100b disposed thereon can be directly disposed on the ground layer 103. Furthermore, only one adhesive layer 104 is used to connect one of the membranes 102 that is disposed with the first sensor electrode 100a to the other membrane 102 that is disposed with the second sensor electrode 100b.

Ninth Embodiment

Figure 13:
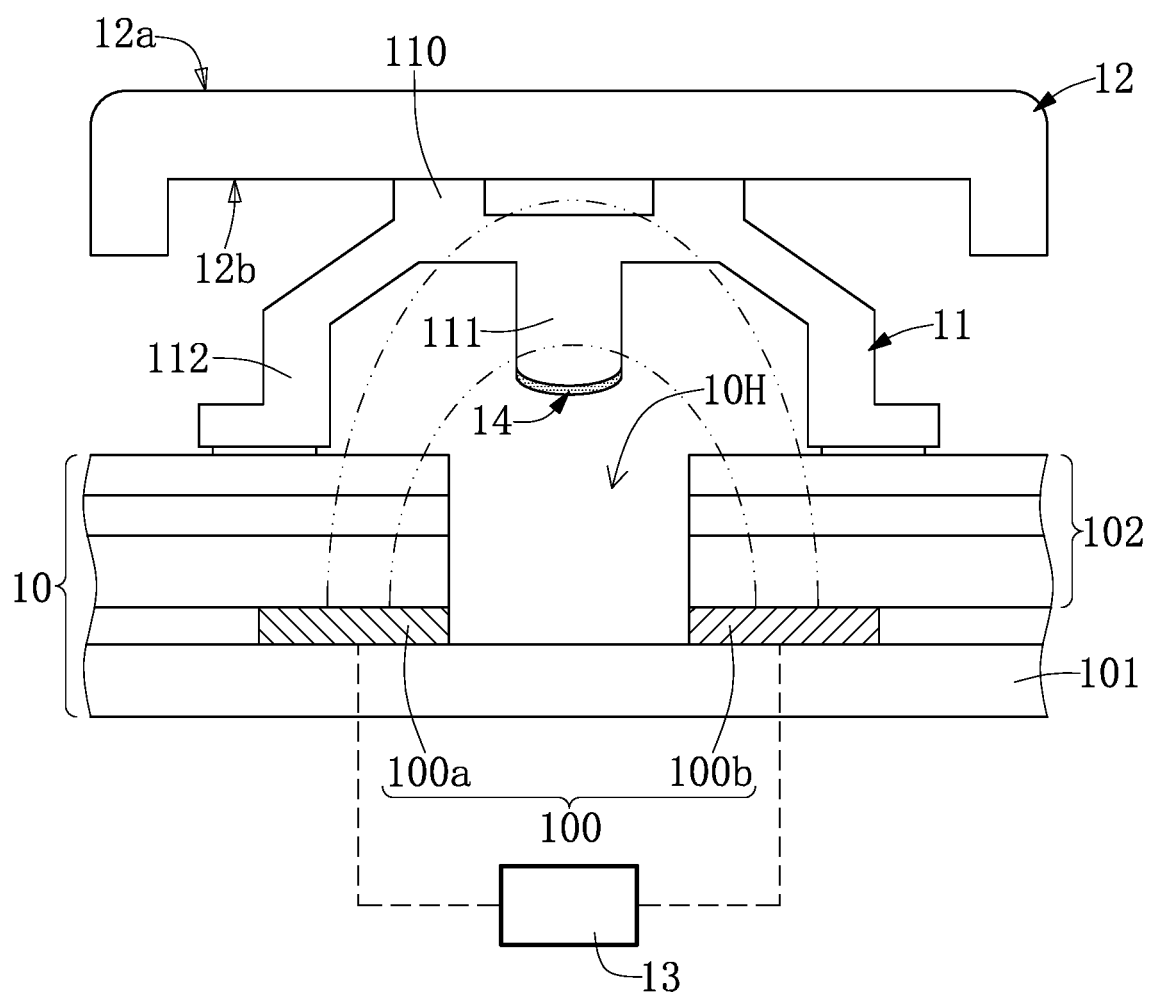
FIG. 13 is a schematic sectional view of a key unit in an undepressed state according to a ninth embodiment of the present disclosure.
Figure 14:
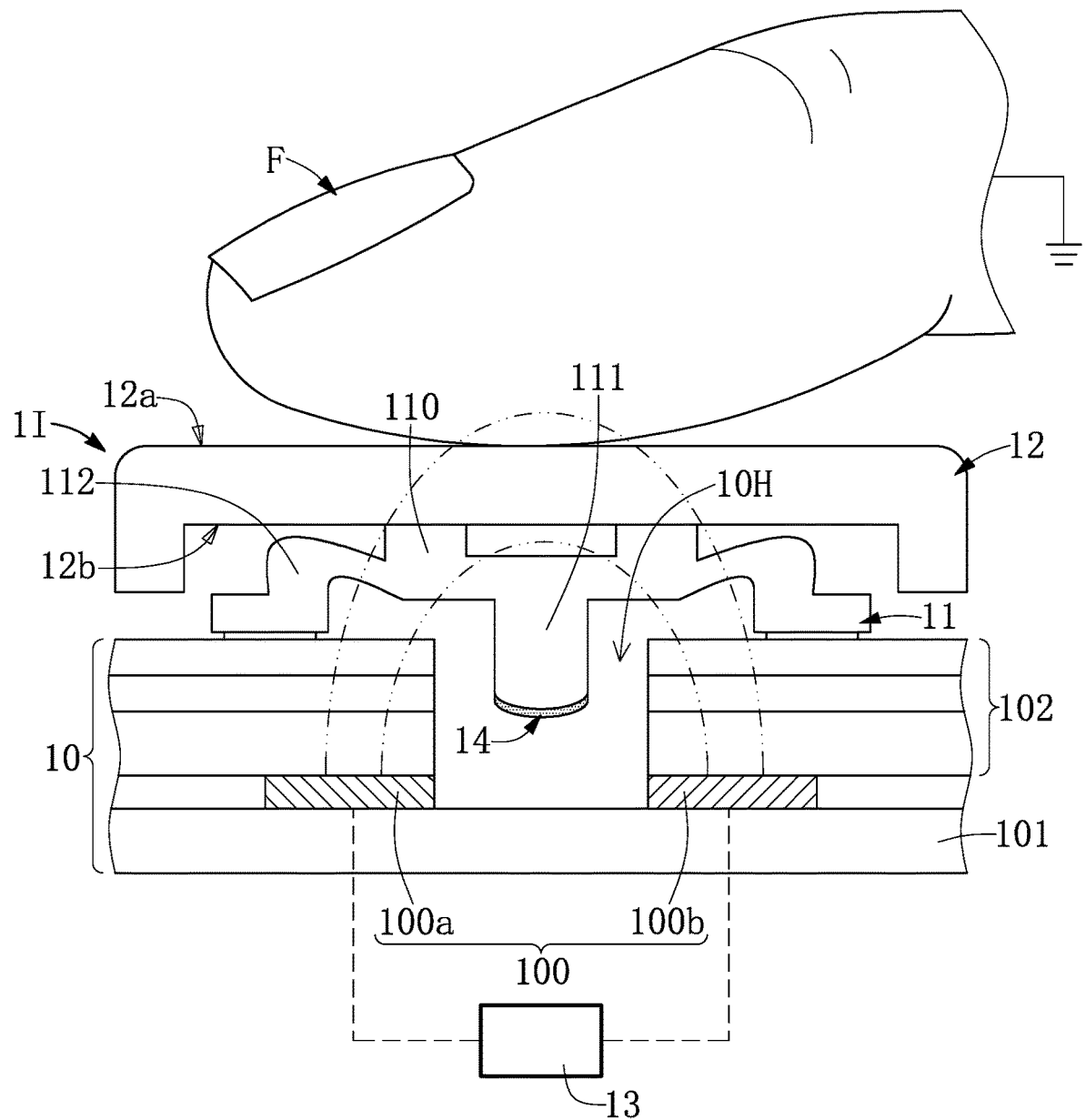
FIG. 14 is a schematic sectional view of the key unit held by a finger in the depressed state according to the ninth embodiment of the present disclosure.

Reference is made to FIG. 13 and FIG. 14, which are schematic sectional views of a key unit respectively in an undepressed state and in a depressed state according to the ninth embodiment of the present disclosure.

In the key unit 1I of the ninth embodiment, the floating conductive structure 14 is a conductive layer that is disposed at the end of the protrusion portion 111.

Furthermore, in the instant embodiment, the circuit board 10 has an opening 10H in alignment with the protrusion portion 111 in the vertical direction. Specifically, the opening 10H of the circuit board 10 extends from an upper surface of the circuit board 10 to the surface of the insulating layer 101 that is formed with the capacitance sensing circuit 100. The position of the opening 10H is offset from the positions of the first and second sensor electrodes 100a, 100b.

In the instant embodiment, the first and second sensor electrodes 100a, 100b are exposed from a sidewall of the circuit board 10 that defines the opening 10H. In another embodiment, the first and second sensor electrodes 100a, 100b may not be exposed, and the present disclosure is not limited to the examples provided herein.

As shown in FIG. 13, when the keycap 12 is not depressed, the protrusion portion 111 of the elastic element 11 is located above the opening 10H. When the keycap 12 is depressed, as shown in FIG. 14, the protrusion portion 111 is pushed into the opening 10H without being in contact with the pair of the first and second sensor electrodes 100a, 100b.

It should be noted that in the instant embodiment, it is not necessary for the protrusion portion 111 to be contact with the bottom of the opening 10H (or the surface of the insulating layer 101). To be more specific, the coupling capacitance would be varied during the depression of the keycap 12 since the floating conductive structure 14 formed at the end of the protrusion portion 111 becomes closer and closer to the capacitance sensing circuit 100 and alters the electric field. Accordingly, the processing circuit 13 can obtain the variation of the coupling capacitance and determine the state of the keycap 12 corresponding thereto.

Tenth Embodiment

Figure 15:
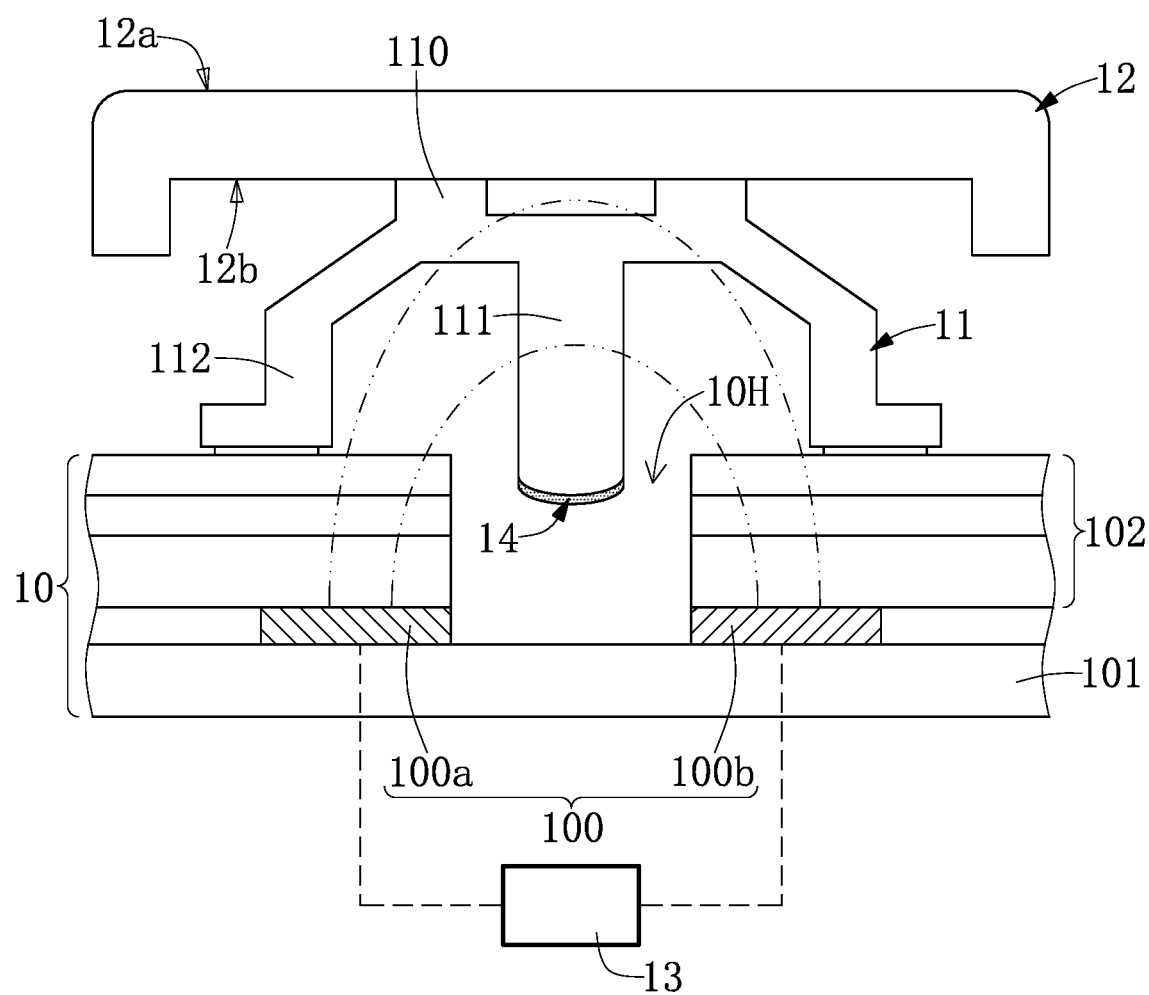
FIG. 15 is a schematic sectional view of a key unit in an undepressed state according to a tenth embodiment of the present disclosure.
Figure 16:
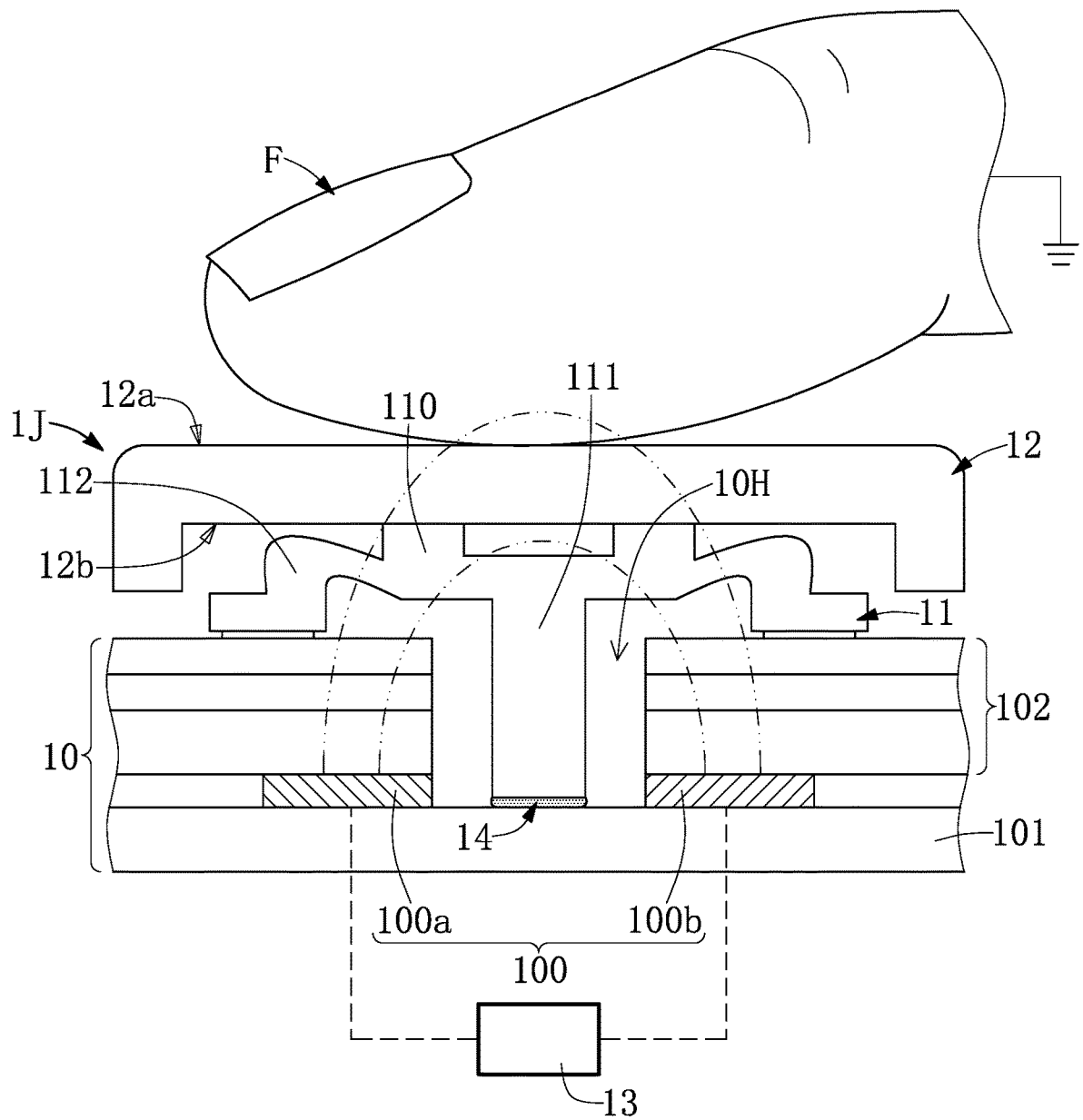
FIG. 16 is a schematic sectional view of the key unit held by a finger in the depressed state according to the tenth embodiment of the present disclosure.

Reference is made to FIG. 15 and FIG. 16, which are schematic sectional views of a key unit respectively in an undepressed state and in a depressed state according to the ninth embodiment of the present disclosure. One of the differences between the key unit 1J of the tenth embodiment, and the key unit 1I of the ninth embodiment is that the protrusion portion 111 of the instant embodiment extends into the opening 10H. As shown in FIG. 15, when the keycap 12 is not depressed, an ending portion of the protrusion portion 111 and the floating conductive structure 14 formed thereon are located in an upper portion of the opening 10H of the circuit board 10.

However, the protrusion portion 111 and the floating conductive structure 14 would be not in contact with the surface of the insulating layer 101 so as to reserve a space that allows the protrusion portion 111 to move downwardly during the depression of the keycap 12.

As shown in FIG. 16, when the keycap 12 is pressed by a user with the finger F, the protrusion portion 111 and the floating conductive structure 14 formed thereon are forced to move from the upper portion to the lower portion of the opening 10H, such that a distance between the floating conductive structure 14 and the capacitance sensing circuit 100 becomes shorter.

As such, the coupling capacitance between the pair of the first and second sensor electrodes 100a, 100b is varied. Accordingly, the processing circuit 13 can obtain the variation of the coupling capacitance and determine the state of the keycap 12 corresponding thereto.

Furthermore, in the instant embodiment, the floating conductive structure 14 that is formed on the protrusion portion 111 may be in contact with the surface of the insulating layer 101 after the keycap 12 is depressed and reaches to its lowest extent. Moreover, the floating conductive structure 14 and the capacitance sensing circuit 100 are located at the same level.

Eleventh Embodiment

Figure 17:
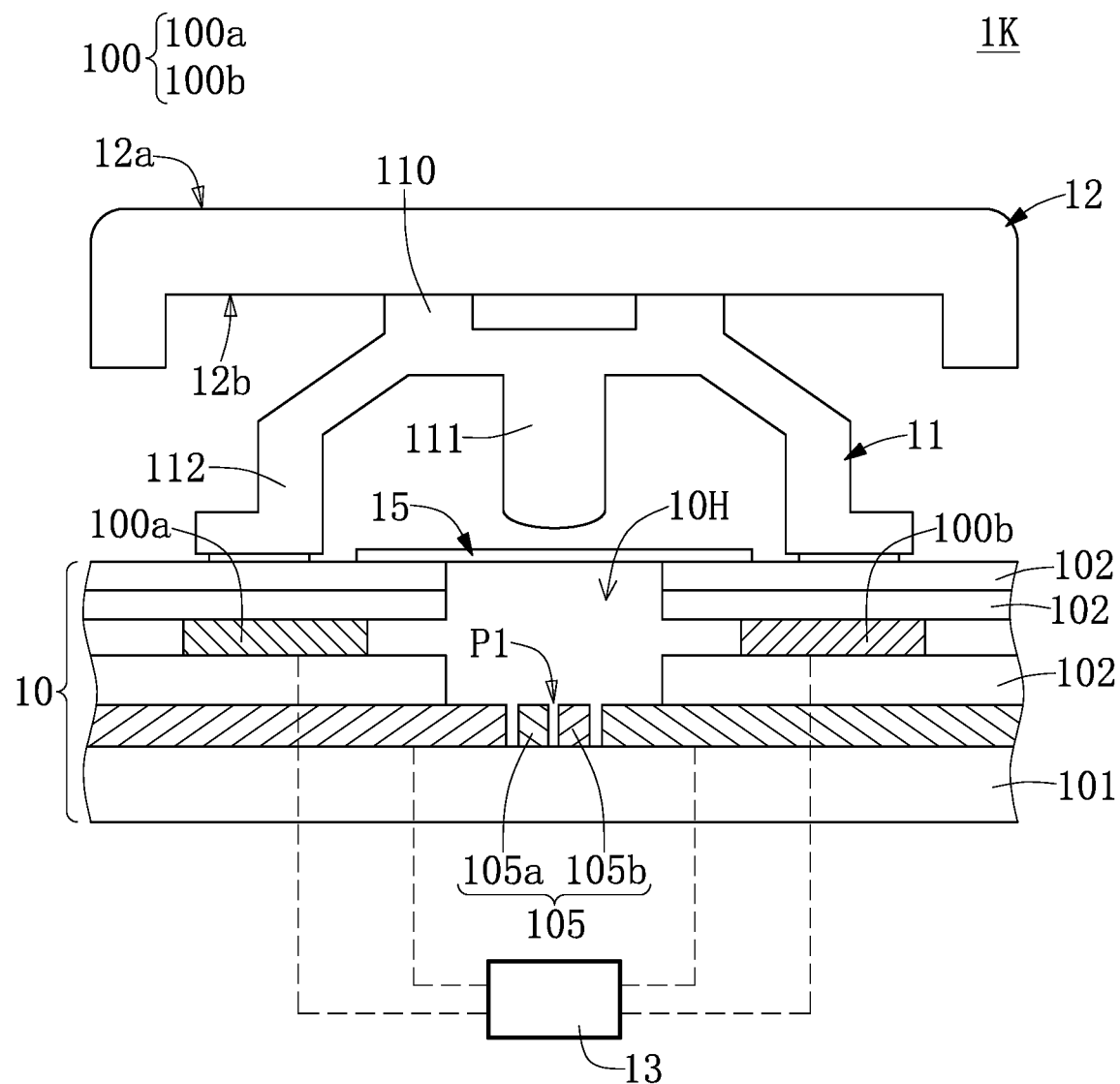
FIG. 17 is a schematic sectional view of a key unit in an undepressed state according to an eleventh embodiment of the present disclosure.

Reference is made to FIG. 17, which is a schematic sectional view of a key unit in an undepressed state according to an eleventh embodiment of the present disclosure. The elements which are similar to or the same as those shown in FIG. 15 are denoted by similar or the same reference numerals, and will not be reiterated herein.

In the key unit 1K of the eleventh embodiment, the circuit board 10 further includes a switch sensing circuit 105 for sensing pressing events. The switch sensing circuit 105 is insulated from and disposed below the capacitance sensing circuit 100. That is to say, in the instant embodiment, the switching sensing circuit 105, the membrane 102 and the capacitance sensing circuit 100 are sequentially disposed on the insulating layer 101, and the switch sensing circuit 105 and the capacitance sensing circuit 100 are spaced apart from each other by the membrane 102.

Moreover, the switch sensing circuit 105 includes a first detecting layer 105a and a second detecting layer 105b. The first detecting layer 105a and the second detecting layer 105b are insulated from each other and alternately arranged at the same insulating layer 101.

As shown in FIG. 17, a portion of the first detecting layer 105a and a portion of the second detecting layer 105b are spaced apart from each other so as to define a contact point P1 therebetween. The contact point P1 is in alignment with the protrusion portion 111 of the elastic element 11 in the vertical direction.

The circuit board 10 also has the opening 10H. The opening 10H passes through a layer of the capacitance sensing circuit 100, but the opening 10H does not pass through the switch sensing circuit 105. That is to say, a portion of the first detecting layer 105a, a portion of the second detecting layer 105b, and the contact point P1 defined therebetween are located at the bottom of the opening 10H.

Furthermore, the switch sensing circuit 105 of each key unit 1K can be electrically connected to the processing circuit 13 to which the capacitance sensing circuit 100 is electrically connected. That is to say, the processing circuit 13 can receive switch signals transmitted by the switch sensing circuit 105 so as to determine whether the keycap 12 is depressed to its lowest extent or not. In another embodiment, the switch sensing circuit 105 and the capacitance sensing circuit 100 can be electrically connected to different processing circuits 13, respectively.

The key unit 1K further includes a flexible conductive film 15 disposed on the circuit board 10 and covering the opening 10H. The flexible conductive film 15 is disposed above and insulated from the capacitance sensing circuit 100. Furthermore, since the opening 10H is below the protrusion portion 111 of the elastic element 11, the flexible conductive film 15 that covers the opening 10H is in alignment with the protrusion portion 111. The flexible conductive film 15 can be made of a conductive and resilient material, such as a carbon film. In the instant embodiment, the floating conductive structure 14 can be omitted.

Figure 18:
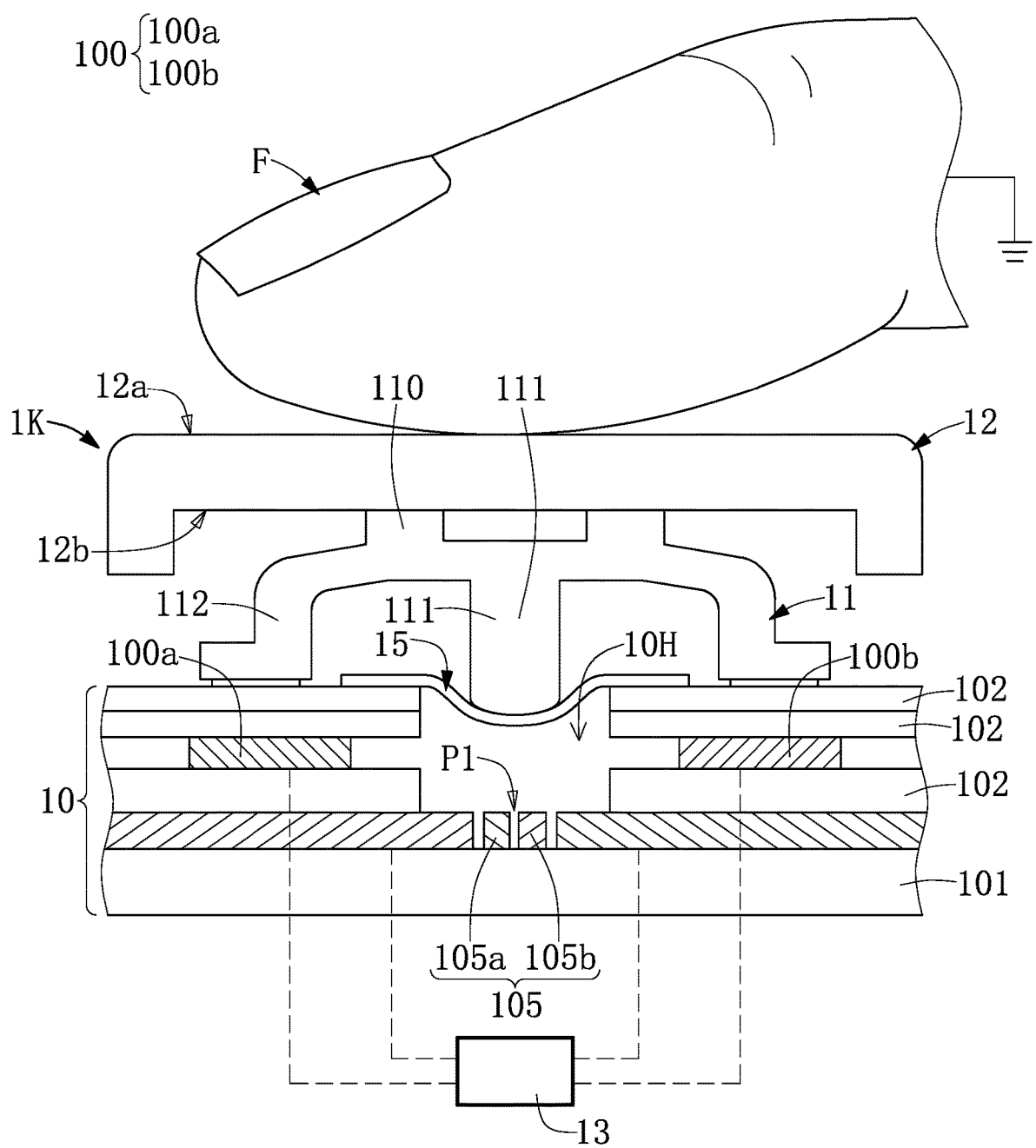
FIG. 18 is a schematic sectional view of the key unit located at a middle position according to the eleventh embodiment of the present disclosure.
Figure 19:
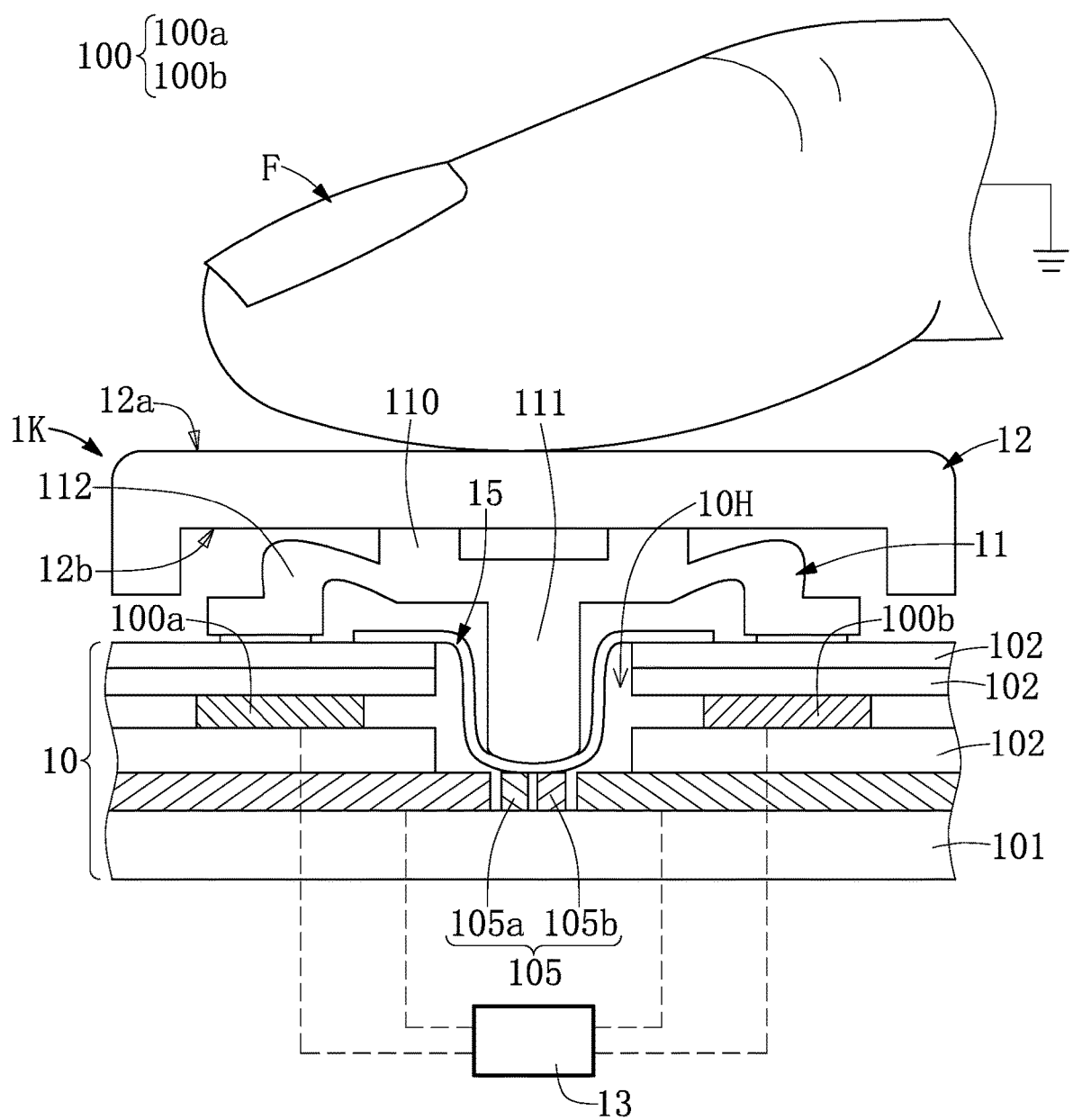
FIG. 19 is a schematic sectional view of the key unit held in the depressed state according to the eleventh embodiment of the present disclosure.

Reference is made to FIG. 17, FIG. 18 and FIG. 19, in which FIG. 18 is a schematic sectional view of the key unit located at a middle position according to the eleventh embodiment of the present disclosure, and FIG. 19 is a schematic sectional view of a key unit held in the depressed state according to the eleventh embodiment of the present disclosure.

As shown in FIG. 18, during the depression of the keycap 12, the protrusion portion 111 moves downwardly and forces the flexible conductive film 15 to deform and become closer to the capacitance sensing circuit 100. That is, when the keycap 12 moves toward the circuit board 10, the protrusion portion 111 forces the flexible conductive film 15 to deform so that the flexible conductive film 15 extends into the opening 10H.

Accordingly, the coupling capacitance would be changed, and the processing circuit 13 can obtain the variation of the coupling capacitance so as to determine whether the keycap 12 is depressed. However, since the flexible conductive film 15 is not in contact with the contact point P1 of the switch sensing circuit 105, the processing circuit 13 does not receive any switch signal.

Reference is made to FIG. 19. When the keycap 12 is depressed to its lowest extent, the protrusion portion 111 moves to the bottom of the opening 10H, such that the flexible conductive film 15 extends into the opening 10H and is in contact with the contact point P1 below. As such, the switch sensing circuit 105 is closed, and the processing circuit 13 can receive the switch signal corresponding to the keycap 12 and determine that the keycap 12 is depressed to its lowest extent.

Accordingly, in the instant embodiment, the processing circuit 13 can obtain both the variation of the coupling capacitance and the switch signal so as to double check the state of the keycap 12, thereby preventing from the "phantom switch" problems. That is to say, in the present disclosure, the accuracy of the processing circuit 13 for determining the state of the keycap 12 can be improved.

Figure 20:
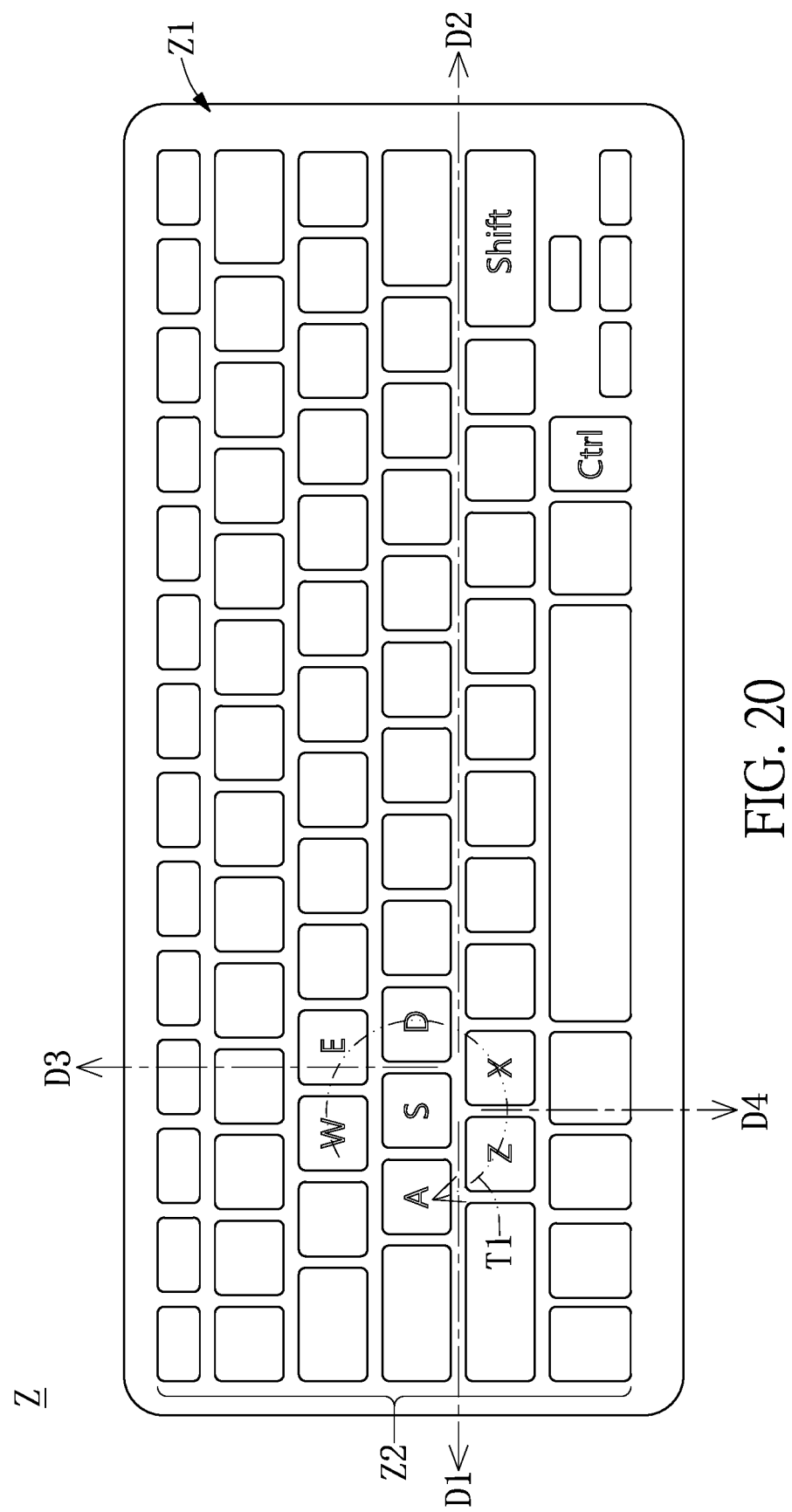
FIG. 20 is a top view of a keyboard according to an embodiment of the present disclosure.
Figure 21:
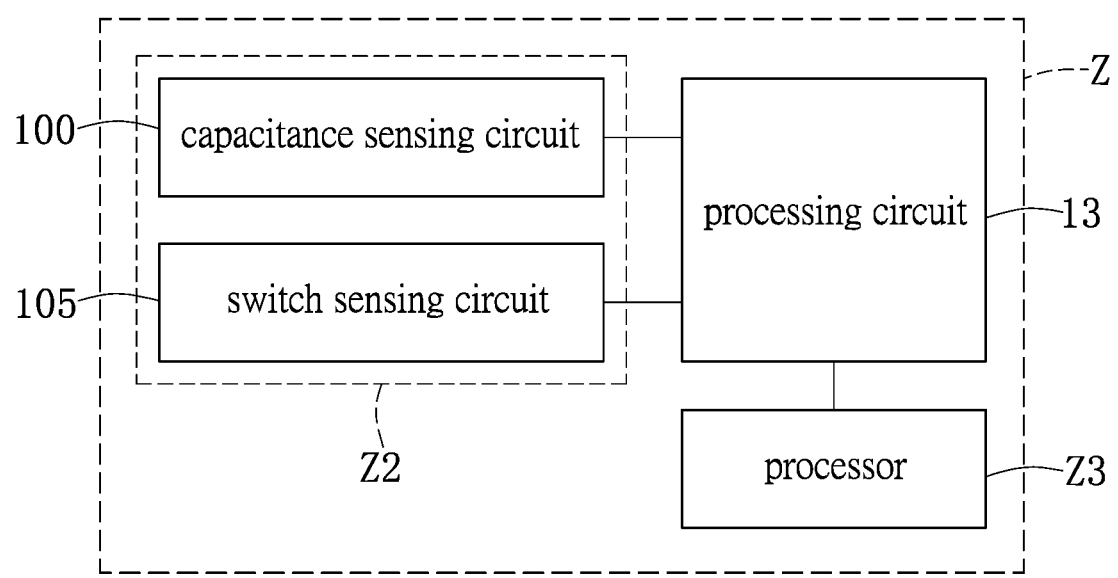
FIG. 21 is a block diagram of a keyboard according to an embodiment of the present disclosure.

Reference is made to FIG. 20 and FIG. 21. FIG. 20 is a top view of a keyboard according to an embodiment of the present disclosure, and FIG. 21 is a block diagram of a keyboard according to an embodiment of the present disclosure.

The keyboard Z is shown as a stand-alone keyboard rather than one integrated with a computer. However, in another embodiment, the keyboard Z can be integrated within the housing or chassis of the computer or other device components, such as a mobile phone, electronic book, computer, laptop, tablet computer, stand-alone keyboard, input device, an accessory (such a tablet case with a build-in keyboard), monitor, electronic kiosk, gaming device, automated teller machine (ATM), vehicle dashboard, control panel, medical workstation, and industrial workstation.

The keyboard Z can be electrically coupled to or integrated in a computer system to serve as a user interface so that a user can input a command. Moreover, the keyboard Z can also include a touchpad and other input mechanisms, which are not shown in FIG. 20, but the present disclosure is not limited to the example provided herein.

As shown in FIG. 20, the keyboard Z includes a housing Z1 and a plurality of key units Z2 that are housed in the housing Z1 and arranged in an array. Specifically, the housing Z1 may include a bottom board and a top plate to define an accommodating space.

The key unit Z2 can be any one of the key units 1A-1K that are respectively described in the first to eleventh embodiments. The key units Z2 can be accommodated in accommodating space defined by the housing Z1. An outer surface of the keycap of each of the key units Z2 is exposed from the housing Z1 for operational convenience. It should be noted that in one embodiment of the present disclosure, the keyboard Z is mechanical keyboard capable of detecting coupling capacitance signals. In one embodiment, the keyboard Z can be a touch sensitive mechanical keyboard for detecting both touching and depression events.

As shown in FIG. 21, the keyboard Z further includes a processor Z3 that is electrically connected to the processing circuit 13 to receive state information of each of the key units Z2. In one embodiment, the processor Z3 can be a programmable logic controller, a logic circuit, a microprocessor, or any combination thereof. In this embodiment, the processor Z3 is electrically connected to the processing circuit 13; however, in another embodiment, the processing circuit 13 can be incorporated into the processor Z3. It should be noted that only one of the key units Z2 is exemplarily shown in FIG. 21. Furthermore, the key unit Z2 having the same functions as those of the key unit 1K shown in FIG. 17 is only taken as an example in the instant embodiment, and the present disclosure is not limited thereto. In another embodiment, the switch sensing circuit 105 may be omitted.

The processing circuit 13 receives coupling capacitance signals transmitted from the capacitance sensing circuit 100 and switch signals transmitted from the switch sensing circuit 105 so as to determine the state of the keycap 12. For example, the processing circuit 13 can determine whether the keycap 12 of the key unit Z2 is touched or not according to the coupling capacitance signals. Moreover, the processing circuit 13 can determine whether the keycap 12 of the key unit Z2 is depressed or not according to either the coupling capacitance signals or the switch signals.

After the processing circuit 13 determines the state of the keycap 12, the processing circuit 13 transmits state information corresponding to the key unit Z2 to the processor Z3, in which the state information may include an address of the key unit Z2 and a state signal of the key unit Z2. The state signals may be a non-contact signal, a touched signal or a depressed signal. In one embodiment, the state information of every one of the key units Z2 can be transmitted by the same processing circuit 13 to the processor Z3.

Specifically, when the key unit Z2 is in a touched state, i.e., the key unit Z2 is touched but not depressed, the processing circuit 13 transmits the address and the touched signal, both of which correspond to the touched key unit Z2, to the processor Z3. When the key unit Z2 is in a depressed state, the processing circuit 13 transmits the address and the depressed signal, both of which correspond to the depressed key unit Z2, to the processor Z3.

In one embodiment, the processor Z3 may be electrically connected to a control chip of a host. The processor Z3 transmits the state information corresponding to a certain key unit to the control chip so that the control chip can execute a program corresponding to the state information of a certain key unit. Reference is made to FIG. 20 in conjunction with FIG. 21. For example, if the key unit Z2 having a character "A" (the "A" key unit) is touched but not depressed, the processing circuit 13 will transmit the state information corresponding to the "A" key unit to the processor Z3. If two or three key units Z2, such as the key units Z2 respectively having characters "A" and "W" (the "A" key unit and the "W" key unit), are touched substantially at the same time, the processing circuit 13 will transmit the state information corresponding to the "A" key unit and the state information corresponding to the "W" key unit to the processor Z3.

Furthermore, in one embodiment, a user can input a command through the keyboard Z by performing a gesture or a movement with an object on the key units Z2. The gesture or the movement may include continuously touching, continuously pressing, or a combination of continuously touching and pressing a series of key units to form a particular trace (such as a clock-wise circle), or holding down on one of the key units while performing the foregoing actions, but the present disclosure is not limited thereto. It should be noted that the processor Z3.

In one embodiment, a gesture or a movement may correspond to a command that is used to control cursor movement displayed on a screen. For example, a user can control the cursor to move along a direction by continuously touching the "D" key unit, the "S" key, and the "A" key unit or by continuously touching the "R" key unit, the "E" key, and the "W" key unit in a first sequence along a first direction D1. Similarly, the user can control the cursor to move along another direction by continuously touching the "D" key unit, the "S" key, and the "A" key unit in a second sequence (i.e., in the reverse sequence to the first sequence) along a second direction D2. Moreover, the cursor can be controlled to move along another direction by continuously touching the "X" key unit, the "S" key, and the "W" key unit in a third sequence along a third direction D3 or in a fourth sequence along a fourth direction D4. That is to say, by continuously touching a series of key units in different directions, the user can control the cursor displayed on the screen to move up, down, left, or right.

In one embodiment, a user can input a command by touching and pressing the "D" key unit, the "S" key, and the "A" key unit. For example, the user can touch the "D" key unit, and then sequentially press the "S" key unit and the "A" key unit so as to input the command corresponding to the movement.

Specifically, when a user touches or/and presses a series of key units Z2 (for example, the "A" key unit, the "S" key unit, and the "D" key unit) in a predetermined sequence, the processing circuit 13 transmits the state information respectively corresponding to the series of key units Z2 to the processor Z3.

In another embodiment, a user can touch a number of the key units Z2 to form a particular trace while the user is holding down on one of the key units Z2 so as to input a command That is to say, a gesture or a movement can be touching a number of key units Z2 (for example, the "W" key unit, the "E" key unit, the "D" key unit, the "X" key unit, the "Z" key unit, and the "A" key unit) to form a particular trace T1 (such as a clock-wise circle) while pressing and holding down on another one of the key units Z2 (such as the "Ctrl" key or the "Shift" key).

Thereafter, according to the state information, the processor Z3 can identify the gesture performed by the user, and transmits an operating signal, which corresponds to the gesture, to the control chip of the host that is electrically connected to the processor Z3. The control chip can executes a specific program according to the operating signal. However, in another embodiment, the step of identifying the gesture of the user can be directly performed by the control chip of the host that is electrically connected to the processor Z3.

Furthermore, the keyboard Z or a host that is electrically connected thereto further includes a memory (not shown in FIG. 21). The memory is electrically connected to the processor Z3 or the control chip of the host, and stores a plurality of operating signals respectively corresponding to different gestures or movements, and stores a plurality of programs respectively corresponding to different operating signals.

For example, the memory stores at least a first program corresponding to a first operating signal and a first gesture and a second program corresponding to the second operating signal and a second gesture. The processor Z3 determines whether the gesture performed by a user is the first gesture, the second gesture, or neither.

When the processor Z3 determines that the gesture performed by a user is the first gesture, the processor Z3 transmits the first operating signal to the control chip, such that the control chip executes the first program according to the first operating signal. Similarly, when the processor Z3 determines that the gesture performed by a user is the second gesture, the control chip executes the second program according to the second operating signal transmitted from the processor Z3.

For example, the first gesture can be touching the series of key units in the first sequence, and the second gesture can be pressing the series of key units Z2 in the second sequence.

However, in another embodiment, the gesture or the movement may be that touching a series of the key units in a clockwise direction or in a counterclockwise direction, and the present disclosure is not limited in this aspect. In conclusion, one of the advantages of the present disclosure is that in the key units 1A-1K and the keyboard Z using the same provided herein, by the technical features of "a circuit board 10 including a capacitance sensing circuit 100 embedded therein," "the capacitance sensing circuit 100 includes a pair of sensor electrodes 100a, 100b which are spaced apart from each other" and "a processing circuit 13 electrically connected to the pair of sensor electrodes 100a, 100b to obtain a variation of a coupling capacitance between the pair of sensor electrodes 100a, 100b and to determine whether the keycap 12 is touched or depressed according to the variation of coupling capacitance," the accuracy of detection can be improved and the "phantom switch" problems can be prevented even if more than two key units Z2 of the keyboard Z are depressed at the same time.

Furthermore, in one embodiment, the keyboard Z can determine whether a series of key units Z2 are continuously touched in a predetermined sequence according to the variations of the coupling capacitance respectively corresponding thereto so that a user can input a specific command by performing a specific gesture or movement.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A key unit comprising:
   a circuit board including a capacitance sensing circuit embedded therein, wherein the capacitance sensing circuit includes a pair of sensor electrodes which are spaced apart from each other, the circuit board has an opening that extends from an upper surface of the circuit board to a position between the sensor electrodes;
   an elastic element disposed on the circuit board, wherein the elastic element includes a protrusion portion that extends toward the circuit board and is in alignment with the opening; and
   a keycap moveably disposed above and spaced apart from the circuit board, wherein the elastic element is disposed between the keycap and the circuit board so that the keycap moves between a non-depressed position and a depressed position with respect to the circuit board;
   a processing circuit electrically connected to the pair of sensor electrodes to obtain a variation of a coupling capacitance between the pair of sensor electrodes and to determine whether the keycap is touched or depressed according to the variation of coupling capacitance;
   when the variation of the coupling capacitance is greater than a first threshold value and less than a second threshold value, the keycap is determined to be touched; and
   when the variation of the coupling capacitance is greater than the second threshold value, the keycap is determined to be depressed.

2. The key unit according to claim 1, further including a floating conductive structure disposed between the keycap and the circuit board or disposed on an outer surface of the keycap, wherein the floating conductive structure moves along with a movement of the keycap.

3. The key unit according to claim 1, wherein the elastic element includes a connection portion that connects to the keycap and the protrusion portion; and
   when the keycap is in a non-depressed position, the protrusion portion is spaced apart from the circuit board.

4. The key unit according to claim 1, further including a floating conductive structure including a first conductive layer disposed on an end of the protrusion portion.

5. The key unit according to claim 1, further including a floating conductive structure including a second conductive layer disposed at an inner surface of the keycap.

6. The key unit according to claim 1, wherein,
   when the keycap moves toward the circuit board, the protrusion portion is pushed into the opening without being in contact with the pair of the sensor electrodes.

7. The key unit according to claim 1, wherein the circuit board further includes:
   a switch sensing circuit having at least a contact point that is in alignment with the protrusion portion, wherein the capacitance sensing circuit is disposed above and insulated from the switch sensing circuit, the opening is in alignment with the contact point, and the opening passes through the capacitance sensing circuit and does not pass through the switch sensing circuit.

8. The key unit according to claim 7, further including a flexible conductive film disposed on and insulated from the capacitance sensing circuit, wherein the flexible conductive film covers the opening;
   when the keycap moves toward the circuit board, the protrusion portion forces the flexible conductive film to deform so that the flexible conductive film extends into the opening to contact the contact point below.

9. The key unit according to claim 1, further including a floating conductive structure including an inner conductive layer and an outer conductive surface respectively disposed on an inner surface and an outer surface of the keycap.

10. The key unit according to claim 1, wherein the circuit board includes a membrane, and the pair of the sensor electrodes are respectively disposed at two opposite sides of the membrane so as to be insulated from each other.

11. A keyboard comprising:
    a plurality of key units, wherein each of the key units includes:
       a circuit board including a capacitance sensing circuit embedded therein, wherein the capacitance sensing circuit includes a pair of sensor electrodes which are spaced apart from each other, the circuit board has an opening that extends from an upper surface of the circuit board to a position between the sensor electrodes;
       an elastic element disposed on the circuit board, wherein the elastic element includes a protrusion portion that extends toward the circuit board and is in alignment with the opening; and
       a keycap moveably disposed above and spaced apart from the circuit board, wherein the elastic element is disposed between the keycap and the circuit board so that the keycap moves between a non-depressed position and a depressed position with respect to the circuit board; and
    a processing circuit electrically connected to the pair of sensor electrodes of each of the key units to obtain a variation of a coupling capacitance between the pair of sensor electrodes and to determine whether the keycap is touched or depressed according to the variation of coupling capacitance;
    when the variation of the coupling capacitance is greater than a first threshold value and less than a second threshold value, the keycap is determined to be touched; and
    when the variation of the coupling capacitance is greater than the second threshold value, the keycap is determined to be depressed.

12. The keyboard according to claim 11, wherein each of the key units further includes a floating conductive structure disposed between the keycap and the circuit board or disposed on an outer surface of the keycap, and the floating conductive structure moves with a motion of the keycap.

13. The keyboard according to claim 11, wherein the elastic element includes a connection portion that connects to the keycap and the protrusion portion; and
    when the keycap is in a non-depressed position, the protrusion portion is spaced apart from the circuit board.

14. The keyboard according to claim 11, wherein each of the key units further includes a floating conductive structure, and the floating conductive structure includes a first conductive layer disposed on an end of the protrusion portion.

15. The keyboard according to claim 11, wherein each of the key units further includes a floating conductive structure, and the floating conductive structure includes a second conductive layer disposed at an inner surface of the keycap.

16. The keyboard according to claim 11, wherein each of the key units further includes a floating conductive structure; when the keycap moves toward the circuit board, the protrusion portion is pushed into the opening without being in contact with the capacitance sensing circuit.

17. The keyboard according to claim 11, wherein the circuit board further includes:
a switch sensing circuit having at least a contact point that is in alignment with the protrusion portion, wherein the capacitance sensing circuit is disposed on and insulated from the switch sensing circuit, the opening is in alignment with the contact point, and the opening passes through the capacitance sensing circuit and does not pass through the switch sensing circuit.

18. The keyboard according to claim 17, further including a flexible conductive film disposed on and insulated from the capacitance sensing circuit, wherein the flexible conductive film covers the opening;
when the keycap moves toward the circuit board, the protrusion portion forces the flexible conductive film to deform so that the flexible conductive film extends into the opening to contact the contact point below.

19. The keyboard according to claim 11, wherein each of the key units further includes a floating conductive structure including an inner conductive layer and an outer conductive surface respectively disposed on an inner surface and an outer surface of the keycap.

20. The keyboard according to claim 11, wherein the circuit board includes a membrane, and the pair of the sensor electrodes are respectively disposed at two opposite sides of the membrane so as to be insulated from each other.

21. The keyboard according to claim 11, further includes a processor electrically connected to the processing circuit, wherein the processor determines whether a series of key units are touched or pressed continuously in a predetermined sequence according to the variations of the coupling capacitance respectively corresponding thereto.

22. The keyboard according to claim 11, further includes a processor electrically connected to the processing circuit and a memory electrically connected to the processor, wherein the memory stores a first program corresponding to a first gesture, and the processor determines whether a gesture performed by a user is the first gesture or not;
wherein the first gesture is touching a number of key units to form a particular trace while pressing and holding down on another one of the key units.

* * * * *